US012712010B2

(12) United States Patent
Lee et al.

(10) Patent No.: US 12,712,010 B2
(45) Date of Patent: Aug. 18, 2026

(54) SEMICONDUCTOR MEMORY DEVICE

(71) Applicant: SAMSUNG ELECTRONICS CO., LTD., Suwon-si (KR)

(72) Inventors: Changyoung Lee, Suwon-si (KR); Chulkwon Park, Suwon-si (KR); Donghak Shin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 118 days.

(21) Appl. No.: 18/754,855

(22) Filed: Jun. 26, 2024

(65) Prior Publication Data

US 2025/0157524 A1 May 15, 2025

(30) Foreign Application Priority Data

Nov. 14, 2023 (KR) ........................ 10-2023-0157706

(51) Int. Cl.
*G11C 11/408* (2006.01)
*G11C 11/4091* (2006.01)
(Continued)

(52) U.S. Cl.
CPC ...... *G11C 11/4085* (2013.01); *G11C 11/4087* (2013.01); *G11C 11/4091* (2013.01);
(Continued)

(58) Field of Classification Search
CPC ............ G11C 11/4085; G11C 11/4087; G11C 11/4091; G11C 5/025; G11C 11/34; H01L 25/0657; H01L 2225/06524; H01L 2224/08145; H01L 2224/80895; H01L 2924/00014; H01L 24/08; H01L 23/5223;
(Continued)

(56) References Cited

U.S. PATENT DOCUMENTS 6,661,079 B1 12/2003 Bikulcius
9,432,298 B1 * 8/2016 Smith .................... H04L 47/34
(Continued)

FOREIGN PATENT DOCUMENTS

CN 21598875 U 3/2022
CN 114520222 A 5/2022
(Continued)

OTHER PUBLICATIONS

Communication dated Jan. 28, 2025, issued by the European Patent Office in European Application No. 24197264.5.

*Primary Examiner* — Michael T Tran
(74) *Attorney, Agent, or Firm* — Sughrue Mion, PLLC

(57) ABSTRACT

A semiconductor memory device is provided. The semiconductor memory device includes: a first chip including a cell area and a remaining area, the cell area including a plurality of memory cells; and a second chip including a core area corresponding to the cell area and a peripheral area corresponding to the remaining area, the first chip and the second chip overlap along a vertical direction. Core circuits are provided in the core area of the second chip and peripheral circuits are provided in the peripheral area of the second chip. The core circuits and the peripheral circuits are configured to control operation of the plurality of memory cells, and passive elements connected to the peripheral circuits of the second chip are provided in the remaining area of the first chip.

20 Claims, 23 Drawing Sheets

(51) Int. Cl.
*H10B 12/00* (2023.01)
*H10B 80/00* (2023.01)
*H10W 90/00* (2026.01)
*H10W 90/20* (2026.01)

(52) U.S. Cl.
CPC ........... *H10B 12/315* (2023.02); *H10B 12/50* (2023.02); *H10B 80/00* (2023.02); *H10W 90/00* (2026.01); *H10W 90/20* (2026.01)

(58) Field of Classification Search
CPC . H01L 23/5227; H01L 23/5228; H01L 25/16; H01L 2225/06527; H01L 2225/06541; H10B 12/315; H10B 12/50; H10B 80/00; H10B 43/27; H10B 43/40
USPC ............................................ 365/200, 230.06
See application file for complete search history.

(56) References Cited

U.S. PATENT DOCUMENTS 10,498,307 B2 12/2019 Velez et al.
10,680,130 B2 6/2020 Moktadir et al.
2009/0057915 A1* 3/2009 Koike ................. H01L 23/4334 257/777
2009/0267848 A1* 10/2009 Kuroda ................ H01Q 1/2283 343/870
2010/0301466 A1* 12/2010 Taoka ................. H01L 25/0657 257/E23.173
2011/0267864 A1* 11/2011 Suzuki ................... G11C 16/06 365/51
2013/0127011 A1 5/2013 Higashitani et al.
2016/0071818 A1* 3/2016 Wang .................... H01L 25/105 257/773
2016/0085038 A1* 3/2016 Decker .................. G02B 6/428 385/14
2016/0216445 A1* 7/2016 Thacker ............... G02B 6/4219
2017/0331371 A1* 11/2017 Parto ......................... G05F 1/46
2020/0091240 A1 3/2020 Hong
2022/0068859 A1 3/2022 Choi et al.
2022/0115390 A1* 4/2022 Lee ........................ H10B 41/35
2022/0406883 A1 12/2022 Kim et al.
2023/0317168 A1* 10/2023 Park ................... G11C 16/0425 365/185.18
2023/0320072 A1* 10/2023 Sukekawa ............. H10B 12/50 257/296

FOREIGN PATENT DOCUMENTS

CN 114823638 A 7/2022
CN 113161348 B 3/2023
CN 116131792 A 5/2023
KR 10-1167196 B1 7/2012
KR 20140003206 A * 1/2014 ......... H01L 23/5384
WO WO-2026050602 A1 * 3/2026 ............ H10W 90/00

* cited by examiner

50

1000A

17

V a b

||| a b

R

18

10000

SEMICONDUCTOR MEMORY DEVICE

CROSS-REFERENCE TO RELATED APPLICATION

This application claims priority under 35 U.S.C. § 119 to Korean Patent Application No. 10-2023-0157706, filed on Nov. 14, 2023, in the Korean Intellectual Property Office, the disclosure of which is incorporated by reference herein in its entirety.

BACKGROUND

The present disclosure relates to a semiconductor memory device.

Semiconductor memory devices are used to store data, and may be classified into volatile memory devices and non-volatile memory devices. The volatile memory devices are memory devices in which stored data is lost when the supply of power is cut off. Among the volatile memory devices, dynamic random access memory (DRAM) is used in various fields such as mobile systems, servers, graphic devices, and the like.

In response to the demand for high integration of semiconductor memory devices, semiconductor memory devices having a stacked structure are being developed. For example, a semiconductor memory device having a cell over peripheral (CoP) structure, in which memory cells for storing data and circuits for driving the memory cells are implemented on separate wafers and then stacked, is being developed.

SUMMARY

Embodiments of the present disclosure provide a semiconductor memory device for improving the characteristics thereof by implementing on-chip passive elements using a cell over peripheral (CoP) structure.

According to an aspect of an example embodiment, a semiconductor memory device including: a first chip including a cell area and a remaining area, the cell area including a plurality of memory cells; and a second chip including a core area corresponding to the cell area and a peripheral area corresponding to the remaining area, the first chip and the second chip overlap along a vertical direction. Core circuits are provided in the core area of the second chip and peripheral circuits are provided in the peripheral area of the second chip. The core circuits and the peripheral circuits are configured to control operation of the plurality of memory cells. Passive elements connected to the peripheral circuits of the second chip are provided in the remaining area of the first chip.

According to another aspect of an example embodiment, a semiconductor memory device includes: a first chip including a cell area, a dummy area and a plurality of cell array mats that are provided in the cell area and spaced apart from the dummy area; and a second chip including a core area and a peripheral area, wherein core circuits configured to drive the plurality of cell array mats, respectively, are provided in the core area and peripheral circuits configured to control operation of the core circuits are provided in the peripheral area, and the first chip and the second chip overlap along a vertical direction. The dummy area of the first chip overlaps the peripheral area of the second chip along the vertical direction and includes passive elements connected to the peripheral circuits of the second chip.

According to another aspect of an example embodiment, a semiconductor memory device includes: a first chip including a cell area, a remaining area and a plurality of memory cells provided in the cell area; and a second chip including a core area and a peripheral area, wherein core circuits are provided in the core area and peripheral circuits are provided in the peripheral area, and the first chip and the second chip overlap along a vertical direction. The first chip includes a plurality of metal layers, and the remaining area of the first chip overlaps the peripheral area of the second chip along the vertical direction and includes an inductor formed using at least one metal layer among the plurality of metal layers of the first chip.

BRIEF DESCRIPTION OF DRAWINGS

The above and other aspects and features of the present disclosure will be more clearly understood from the following description of example embodiments, taken in conjunction with the accompanying drawings, in which.

DETAILED DESCRIPTION

Figure 1:
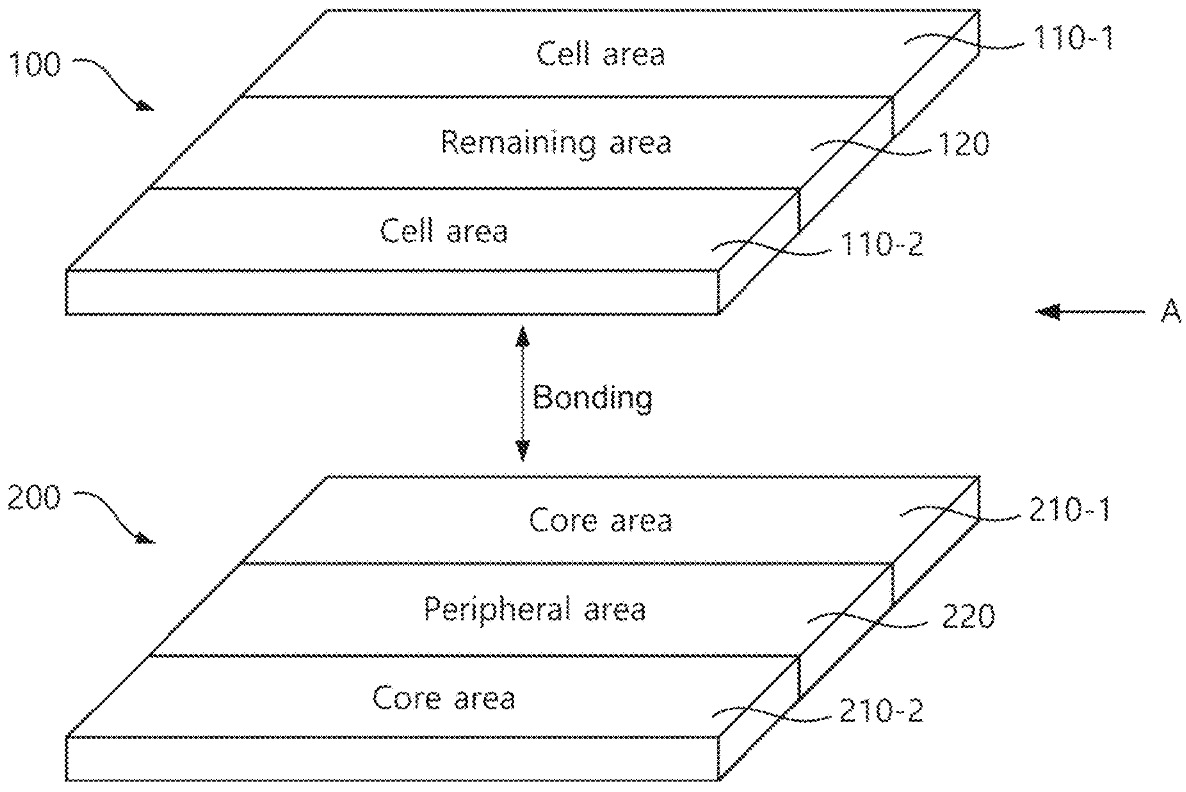
FIG. 1 is a conceptual diagram illustrating a configuration of a semiconductor memory device according to an example embodiment.

Hereinafter, example embodiments will be described with reference to the accompanying drawings. Like components are denoted by like reference numerals throughout the specification, and repeated descriptions thereof are omitted. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Embodiments described herein are example embodiments, and thus, the present disclosure is not limited thereto, and may be realized in various other forms. Each example embodiment provided in the following description is not excluded from being associated with one or more features of another example or another example embodiment also provided herein or not provided herein but consistent with the present disclosure.

Terms, such as "first", "second", and the like used herein may be used to refer to various components regardless of the order and/or the priority and to distinguish the relevant components from other components, but do not limit the components.

FIG. 1 is a conceptual diagram illustrating a configuration of a semiconductor memory device according to an example embodiment.

Referring to FIG. 1, the semiconductor memory device 1000 may include a first chip 100 and a second chip 200. The first chip 100 may be stacked on the second chip 200, and in this regard may have a stacked structure. For example, the first chip 100 and the second chip 200 may have a cell over peripheral (CoP) structure.

The CoP structure may be a structure in which a first wafer including a plurality of memory cells and a second wafer including core circuits and peripheral circuits are separately manufactured and then stacked. For example, the first wafer may be stacked on and connected to the second wafer. Hereinafter, the first wafer (or, the first die) on which the memory cells are disposed may be referred to as the first chip. In addition, the second wafer (or, the second die) on which the core circuits and the peripheral circuits for controlling operation of the memory cells are disposed may be referred to as the second chip.

According to an example embodiment, the first chip 100 and the second chip 200, which have the CoP structure, may be electrically connected to each other by a bonding method. For example, the first chip 100 and the second chip 200 may be electrically connected to each other by bonding first bonding metals formed at the bottom of the first chip 100 and second bonding metals formed at the top of the second chip 200. Alternatively, according to an example embodiment, the first chip 100 and the second chip 200, which have the CoP structure, may be electrically connected with each other through a through-silicon via (TSV).

The first chip 100 may include a plurality of memory cells. According to an example embodiment, the first chip 100 may include cell areas 110-1 and 110-2 that include the plurality of memory cells and a remaining area 120 that does not include the plurality of memory cells. Here, the remaining area 120 may be referred to as an empty area or a dummy area.

In an example embodiment, the first chip 100 may include the first cell area 110-1 and the second cell area 110-2 spaced apart from each other. In addition, the first chip 100 may include the remaining area 120 located between the first cell area 110-1 and the second cell area 110-2. However, without being limited thereto, the numbers of cell areas and remaining areas or the positions thereof may vary depending on example embodiments.

The cell areas 110-1 and 110-2 may include a memory cell array. The memory cell array may include a plurality of memory cells formed at the intersections of word lines and bit lines. According to an example embodiment, the memory cell array may include a plurality of cell array mats divided from one another depending on areas that are controlled by different sub-word line drivers.

The second chip 200 may include core circuits and peripheral circuits for controlling operation of the plurality of memory cells included in the first chip 100. The core circuits may include, for example, a sub-word line driver, a bit line sense amplifier, a row decoder (or, an X-decoder), and a column decoder (or, a Y-decoder). The peripheral circuits may include various circuits for decoding commands and controlling input/output of addresses and data. That is, the peripheral circuits may include various circuits for controlling operation of the core circuits. For example, the peripheral circuits may include control logic, an address buffer, a delayed locked loop (DLL), a data I/O buffer, a power circuit, and the like. In some example embodiments, the row decoder (or, the X-decoder) and the column decoder (or, the Y-decoder) may be classified as peripheral circuits.

The second chip 200 may include core areas 210-1 and 210-2 in which the core circuits are disposed and a peripheral area 220 in which the peripheral circuits are disposed. According to an example embodiment, the core areas 210-1 and 210-2 may correspond to the cell areas 110-1 and 110-2, and the peripheral area 220 may correspond to the remaining area 120. For example, in a state in which the first chip 100 and the second chip 200 are bonded to each other, the cell areas 110-1 and 110-2 may overlap the core areas 210-1 and 210-2, and the remaining area 120 may overlap the peripheral area 220. However, example embodiments are not limited thereto.

In an example embodiment, the second chip 200 may include the first core area 210-1 including first core circuits corresponding to the memory cells included in the first cell area 110-1 and the second core area 210-2 including second core circuits corresponding to the memory cells included in the second cell area 110-2. Because the first cell area 110-1 and the second cell area 110-2 are spaced apart from each other as described above, the first core area 210-1 and the second core area 210-2 may also be spaced apart from each other. In addition, the second chip 200 may include the peripheral area 220 located between the first and second core areas 210-1 and 210-2. The peripheral area 220 may include peripheral circuits for controlling operation of the first and second core circuits.

The numbers of core areas and peripheral areas or the positions thereof are not limited to the above-described example and may vary without any specific limitation depending on example embodiments. However, the number of core areas or the positions of the core areas correspond to the number of cell areas or the positions of the cell areas, and the number of peripheral areas or the positions of the peripheral areas correspond to the number of remaining areas or the positions of the remaining areas.

As described above, the second chip 200 includes the peripheral area 220. Because the peripheral circuits are disposed in the peripheral area 220, core circuits are unable to be disposed in the peripheral area 220. When corresponding core circuits do not exist, memory cells are unable to be driven even if the memory cells exist. Therefore, the memory cells are not disposed in the remaining area 120 corresponding to the peripheral area 220. That is, the first chip 100 includes an empty area (that is, a remaining area or a dummy area) in which memory cells for storing data are not disposed.

According to example embodiments, passive elements connected to the peripheral circuits may be implemented within the remaining area 120. Accordingly, the characteristics of the semiconductor memory device 1000 may be improved.

Specifically, to improve the characteristics of the semiconductor memory device such as bandwidth and operating speed, detailed design of peripheral circuits such as an I/O circuit or a DC circuit is important. To this end, the peripheral circuits may be designed by appropriately using passive elements such as an inductor, a resistor, and a capacitor as needed. However, in the case of a related semiconductor memory device, memory cells, core circuits, and peripheral circuits are all implemented on one wafer, and therefore there is a space limitation in implementing on-chip passive elements.

For example, in the case of the related semiconductor memory device, it is difficult to implement an inductor having sufficient inductance due to the space limitation when implementing an on-chip inductor. However, according to example embodiments, an on-chip inductor having a required magnitude of inductance may be implemented in the remaining area 120 without an increase in chip size.

Furthermore, according to example embodiments, various filters required for the peripheral circuits may be implemented without an increase in chip size by a combination of the passive elements in the remaining area 120. In addition, according to example embodiments, various types of delay logic required for the peripheral circuits may be implemented without an increase in chip size by a combination of the passive elements in the remaining area 120.

Hereinafter, layouts of semiconductor memory devices will be described with reference to FIGS. 2A and 2B.

Figure 2A:
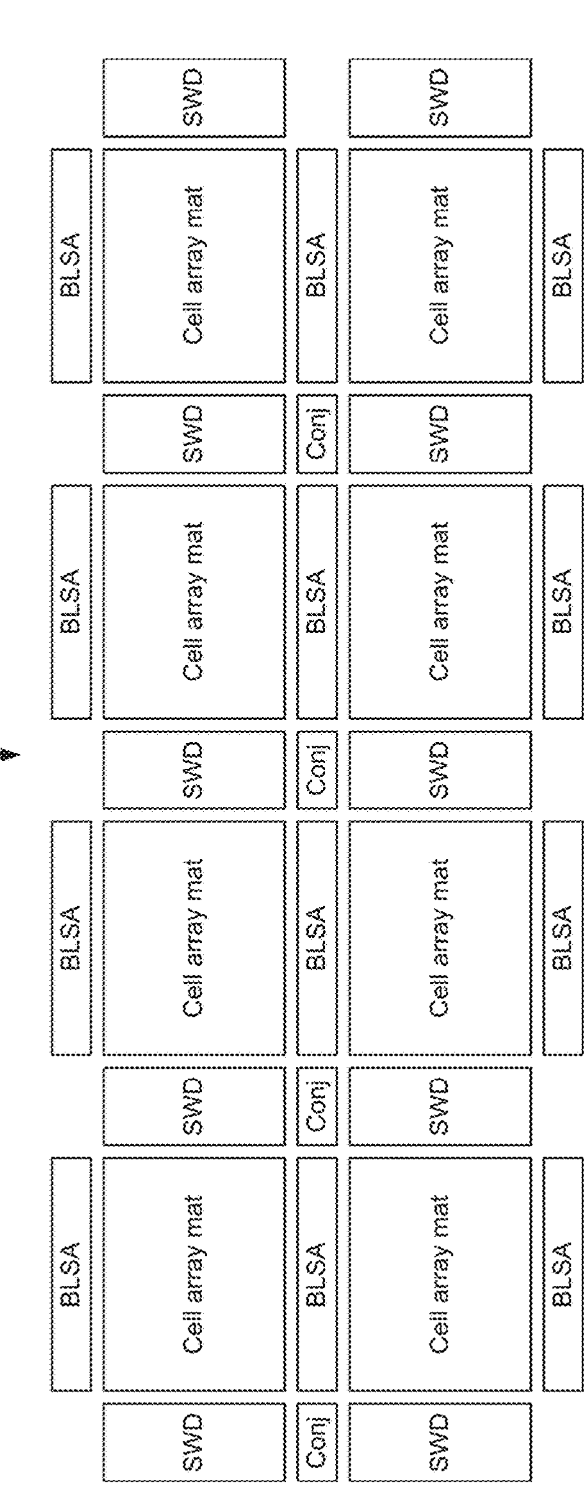
FIG. 2A is a view illustrating the layout of a related semiconductor memory device.

FIG. 2A is a view illustrating the layout of a related semiconductor memory device. In the related semiconductor memory device, a memory cell array, core circuits, and peripheral circuits may be implemented in one chip 50.

Referring to FIG. 2A, a unit core including a cell array mat, a sub-word line driver SWD, a bit line sense amplifier BLSA, and a conjunction area Conj may be disposed in a first area 51 of the chip 50. Unit cores may be arranged in a matrix form in the chip 50. For example, an enlarged view of one area 60 of the chip 50 is illustrated in the lower portion of FIG. 2A. Specifically, in one direction, a plurality of sub-word line drivers SWD may be disposed between a plurality of cell array mats, and in another direction, a plurality of bit line sense amplifiers BLSA may be disposed between the cell array mats. Conjunction areas Conj may be disposed between the plurality of sub-word line drivers SWD and the plurality of bit line sense amplifiers BLSA. In some example embodiments, a voltage driver (or, a voltage repeater) may be disposed in each of the conjunction areas Conj.

A row decoder may be disposed in a second area 52 of the chip 50, and a column decoder may be disposed in a third area 53 of the chip 50. In addition, control logic, an address buffer, a DLL, a data I/O buffer, a power circuit, and the like may be disposed in a fourth area 54.

Figure 2B:
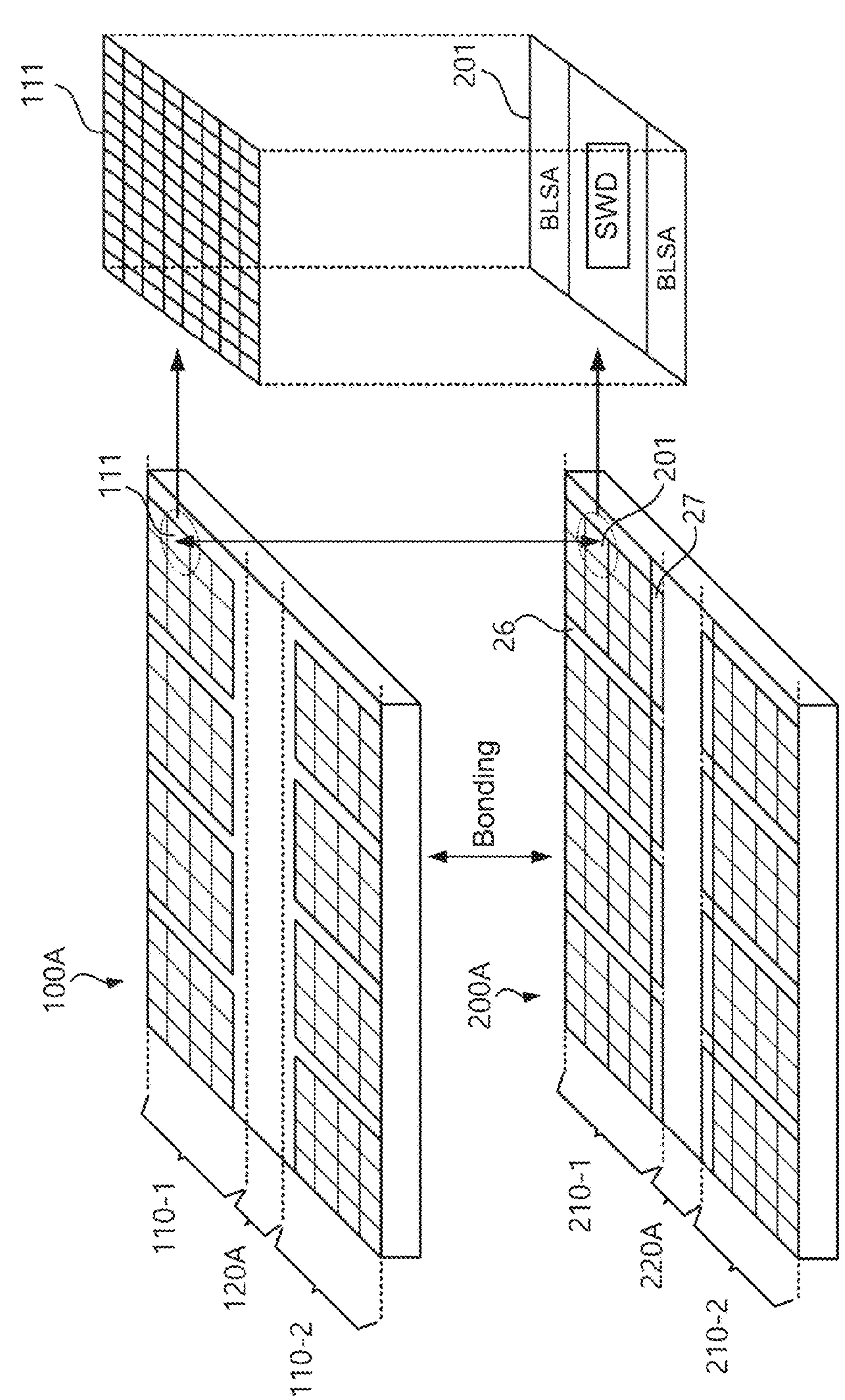
FIG. 2B is a view illustrating the layout of a semiconductor memory device according to an example embodiment.

FIG. 2B is a view illustrating the layout of a semiconductor memory device according to an example embodiment. Referring to FIG. 2B, the semiconductor memory device 1000A may have a CoP structure in which a first chip 100A in which memory cells are implemented and a second chip 200A in which core circuits and peripheral circuits are implemented are bonded to each other.

The first chip 100A may include a first cell area 110-1 and a second cell area 110-2. In addition, the first chip 100A may include a remaining area 120A located between the first cell area 110-1 and the second cell area 110-2. Each of the first cell area 110-1 and the second cell area 110-2 may include a plurality of cell array mats 111.

When compared to the first area 51 in which the unit core of FIG. 2A is disposed, each cell array mat 111 of the first chip 100A may not have a sub-word line driver SWD, a bit line sense amplifier BLSA, and a conjunction area Conj around the cell array mat 111. In this case, a sub-word line driver SWD, a bit line sense amplifier BLSA, and a conjunction area Conj for driving each cell array mat 111 may be disposed in a first area 201 of core areas 210-1 and 210-2 of the second chip 200A that corresponds to the corresponding cell array mat 111. Therefore, each cell array mat 111 may occupy a larger space.

The second chip 200A may include the first core area 210-1 and the second core area 210-2. The first core area 210-1 and the second core area 210-2 may correspond to the first cell area 110-1 and the second cell area 110-2, respectively. Specifically, the first core area 210-1 may include first core circuits corresponding to the cell array mats 111 included in the first cell area 110-1. The second core area 210-2 may include second core circuits corresponding to the cell array mats 111 included in the second cell area 110-2.

The first and second core circuits may include a sub-word line driver SWD, a bit line sense amplifier BLSA, and a conjunction area Conj for driving each cell array mat 111. In addition, the first and second core circuits may include a row decoder and a column decoder. According to an example embodiment, the row decoder may be included in a second area 26 of the core areas 210-1 and 210-2, and the column decoder may be included in a third area 27 of the core areas 210-1 and 210-2. However, example embodiments are not limited thereto.

The second chip 200A may include a peripheral area 220A located between the first core area 210-1 and the second core area 210-2. The peripheral area 220A may include peripheral circuits for controlling operation of the first and second core circuits. For example, the peripheral area 220A may include various circuits for decoding commands and controlling input/output of addresses and data. In an example embodiment, control logic, an address buffer, a DLL, a data I/O buffer, a power circuit, and the like may be disposed in the peripheral area 220A. However, example embodiments are not limited thereto.

Core circuits are not disposed in the peripheral area 220A. Accordingly, memory cells are not disposed in the remaining area 120A corresponding to the peripheral area 220A. According to an example embodiment, passive elements connected to the peripheral circuits included in the peripheral area 220A may be implemented in the remaining area 120A. For example, an inductor may be implemented in the remaining area 120A. Furthermore, a resistor and/or a capacitor may be implemented in the remaining area 120A. In addition, a filter or delay logic may be implemented in the remaining area 120A by a combination of the passive elements. The characteristics of the semiconductor memory device 1000A may be improved without an increase in chip size through the passive elements, the filter, and the delay logic implemented as described above.

The layout illustrated in FIG. 2B is only an example, and it is apparent that the layout of the semiconductor memory device 1000A according to an example embodiment is not limited to that illustrated in FIG. 2B.

For example, in some example embodiments, the row decoder and the column decoder may be classified as peripheral circuits rather than core circuits. In this case, as illustrated in FIG. 2C, cell areas and a remaining area may be divided from one another unlike in FIG. 2B.

Figure 2C:
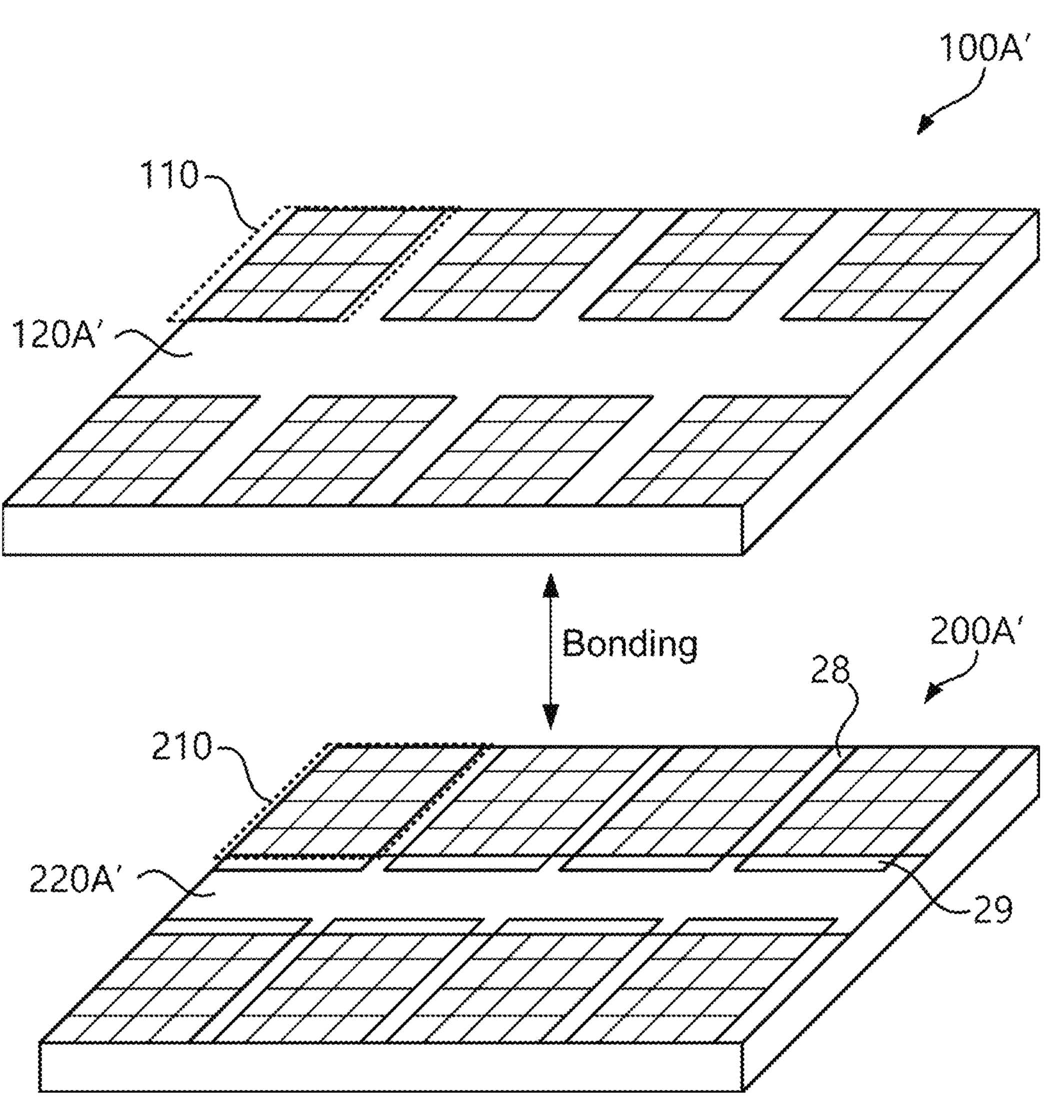
FIG. 2C is a view illustrating the layout of a semiconductor memory device according to an example embodiment.

FIG. 2C is a view illustrating the layout of a semiconductor memory device according to an example embodiment. Referring to FIG. 2C, the semiconductor memory device 1000A' may have a CoP structure in which a first chip 100A', in which memory cells are implemented, and a second chip 200A', in which core circuits and peripheral circuits are implemented, are bonded to each other.

The first chip 100A' may include eight cell areas 110 in which the memory cells are disposed and a remaining area 120A'. The remaining area 120A' may correspond to all areas of the first chip 100A' other than the cell areas 110. Passive elements may be implemented in the remaining area 120A' as described above.

The second chip 200A' may include eight core areas 210 that correspond to the eight cell areas 110, respectively. A sub-word line driver SWD and a bit line sense amplifier BLSA may be included in each of the core areas 210.

In addition, the second chip 200A' may include a peripheral area 220A'. The peripheral area 220A' may correspond to all areas of the second chip 200A' other than the core areas 210. That is, the peripheral area 220A' may include not only the area 220A in which the peripheral circuits described with reference to FIG. 2B are disposed but also an area 28 in which a row decoder is disposed and an area 29 in which a column decoder is disposed.

Hereinafter, the structure of a semiconductor memory device according to an example embodiment will be described with reference to FIGS. 3A to 3C.

Figure 3A:
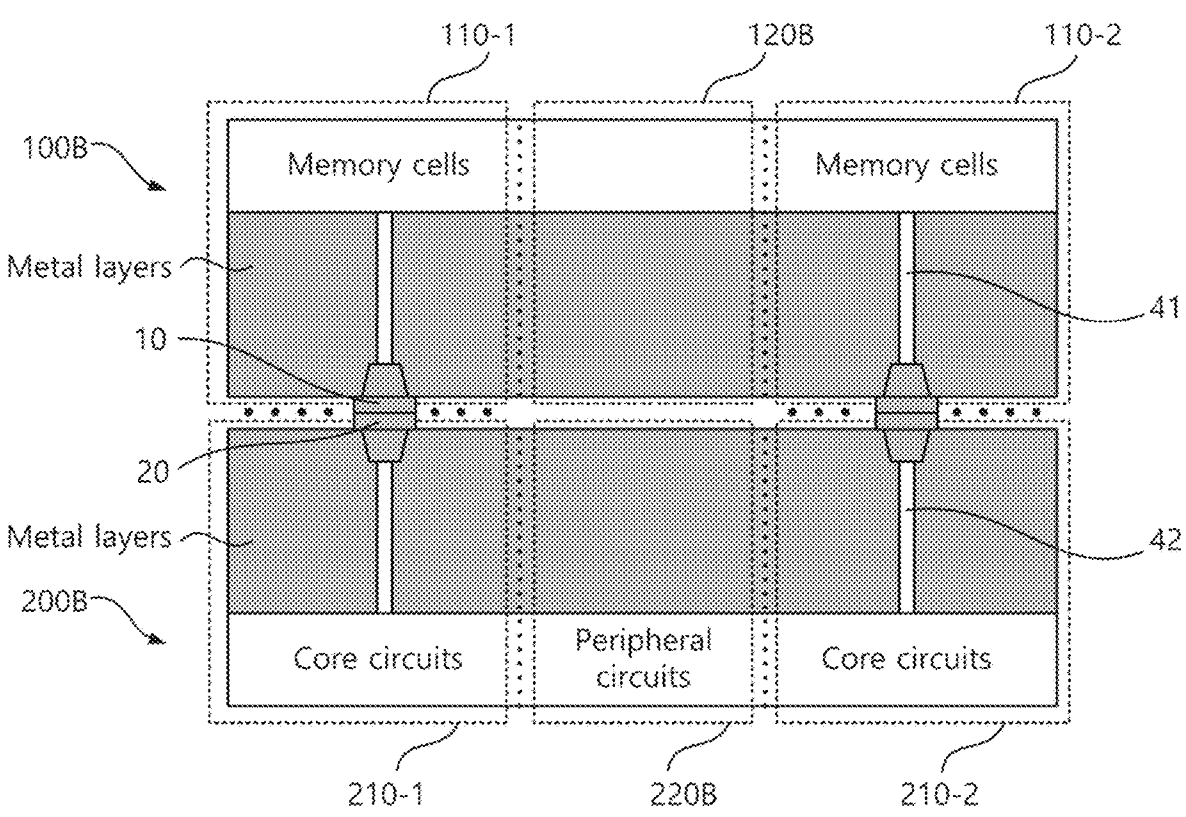
FIG. 3A is a view of a configuration of a semiconductor memory device according to an example embodiment.

FIG. 3A is a view of a configuration of the semiconductor memory device according to an example embodiment as viewed in a direction A in FIG. 1. The semiconductor memory device 1000B may be an example of the semiconductor memory devices 1000 and 1000A of FIGS. 1 and 2B. However, example embodiments are not limited thereto. Referring to FIG. 3A, the semiconductor memory device 1000B may include a first chip 100B and a second chip 200B.

The first chip 100B and the second chip 200B may have a CoP structure in which the first chip 100B is stacked on the second chip 200B. According to an example embodiment, the first chip 100B and the second chip 200B may be electrically connected to each other by bonding first bonding metals 10 formed at the bottom of the first chip 100B and second bonding metals 20 formed at the top of the second chip 200B. The materials of the first and second bonding metals 10 and 20 may include copper (Cu). In this case, a method of bonding the first chip 100B and the second chip 200B may be referred to as a Cu—Cu bonding method. However, example embodiments are not limited thereto, and in some example embodiments, the first and second bonding metals 10 and 20 may be formed of another metallic material such as aluminum (Al) or tungsten (W).

The first chip 100B may include a first cell area 110-1 and a second cell area 110-2. In addition, the first chip 100B may include a remaining area 120B located between the first cell area 110-1 and the second cell area 110-2. Each of the first cell area 110-1 and the second cell area 110-2 may include memory cells.

The second chip 200B may include a first core area 210-1 and a second core area 210-2. The first core area 210-1 and the second core area 210-2 may correspond to the first cell area 110-1 and the second cell area 110-2, respectively. Specifically, the first core area 210-1 may include first core circuits corresponding to the memory cells included in the first cell area 110-1. The second core area 210-2 may include second core circuits corresponding to the memory cells included in the second cell area 110-2.

The second chip 200B may include a peripheral area 220B located between the first core area 210-1 and the second core area 210-2. The peripheral area 220B may include peripheral circuits for controlling operation of the first and second core circuits.

Core circuits are not disposed in the peripheral area 220B. Accordingly, memory cells are not disposed in the remaining area 120B corresponding to the peripheral area 220B. According to an example embodiment, passive elements connected to the peripheral circuits included in the peripheral area 220B may be implemented in the remaining area 120B.

Each of the first chip 100B and the second chip 200B may include a plurality of metal layers. For example, the first chip 100B may include a plurality of metal layers under the memory cells. In addition, the second chip 200B may include a plurality of metal layers over the core circuits and the peripheral circuits.

According to an example embodiment, signals generated in the core circuits of the second chip 200B may be transferred to the second bonding metals 20 through the metal layers and VIAs 42 of the second chip 200B. The signals transferred to the second bonding metals 20 may be transferred to the first chip 100B through the first bonding metals 10. The signals transferred to the first chip 100B may be transferred to word lines or bit lines connected to the memory cells through the metal layers and VIAs 41 of the first chip 100B.

Figure 3B:
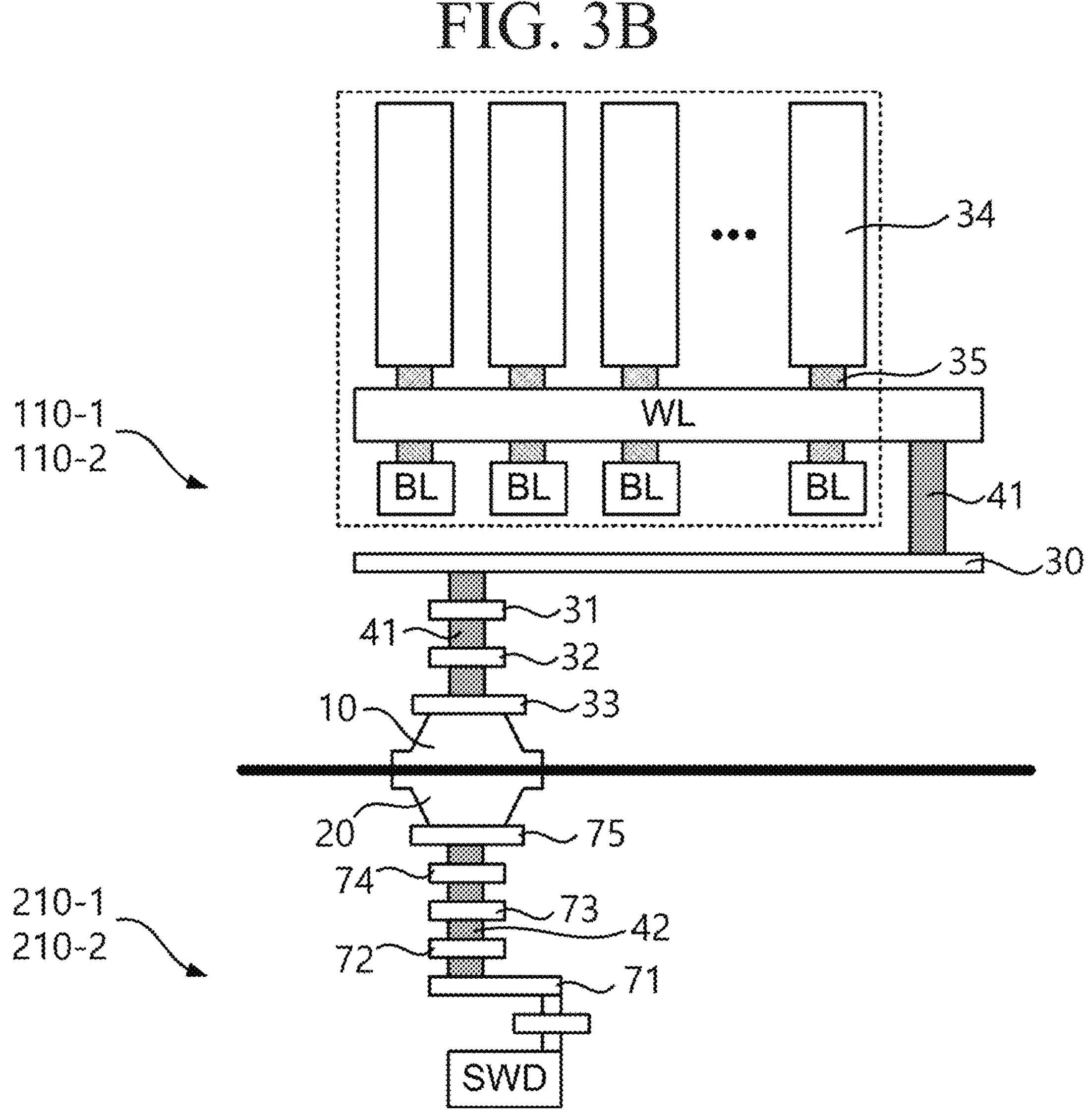
FIG. 3B is a view illustrating a section of a cell area and a core area of a semiconductor memory device according to an example embodiment.

FIG. 3B illustrates an example of a section of a cell area and a core area of the semiconductor memory device of FIG. 3A along a word line.

Referring to FIG. 3B, each of the cell areas 110-1 and 110-2 may include a plurality of memory cells formed at the intersections of a plurality of word lines WL and a plurality of bit lines BL. According to an example embodiment, each of the memory cells may be a dynamic random access memory (DRAM) cell including a vertical channel transistor 35 and a capacitor 34, but example embodiments are not limited thereto.

As described above, the first chip 100B may include a plurality of metal layers 30, 31, 32, and 33 formed under the memory cells. In some example embodiments, each of the plurality of metal layers 30, 31, 32, and 33 may be implemented with various materials such as aluminum, copper, or tungsten. In an example embodiment, among the plurality of metal layers 30, 31, 32, and 33, the first and second metal layers 30 and 31 located at higher positions may be copper layers, and the third and fourth metal layers 32 and 33 located at lower positions may be tungsten layers. However, example embodiments are not limited thereto. Drive signals of sub-word line drivers SWD transferred to the first chip 100B through the first and second bonding metals 10 and 20 may be applied to the word lines WL through the plurality of metal layers 30, 31, 32, and 33 and the VIAs 41.

The core areas 210-1 and 210-2 may include core circuits corresponding to the memory cells. For example, the core areas 210-1 and 210-2 may include the sub-word line drivers SWD disposed under the corresponding cell array mats. In an example embodiment, unlike the memory cells of the cell areas 110-1 and 110-2, the sub-word line drivers SWD may be implemented using a horizontal channel transistor, but example embodiments are not limited thereto.

Drive signals generated by the sub-word line drivers SWD may be transferred to the second bonding metals 20 through a plurality of metal layers 71, 72, 73, 74, and 75 and the VIAs 42 formed over the sub-word line drivers SWD. In some example embodiments, each of the plurality of metal layers 71, 72, 73, 74, and 75 included in the core areas 210-1 and 210-2 may be implemented with various materials such as aluminum, copper, or tungsten.

Figure 3C:
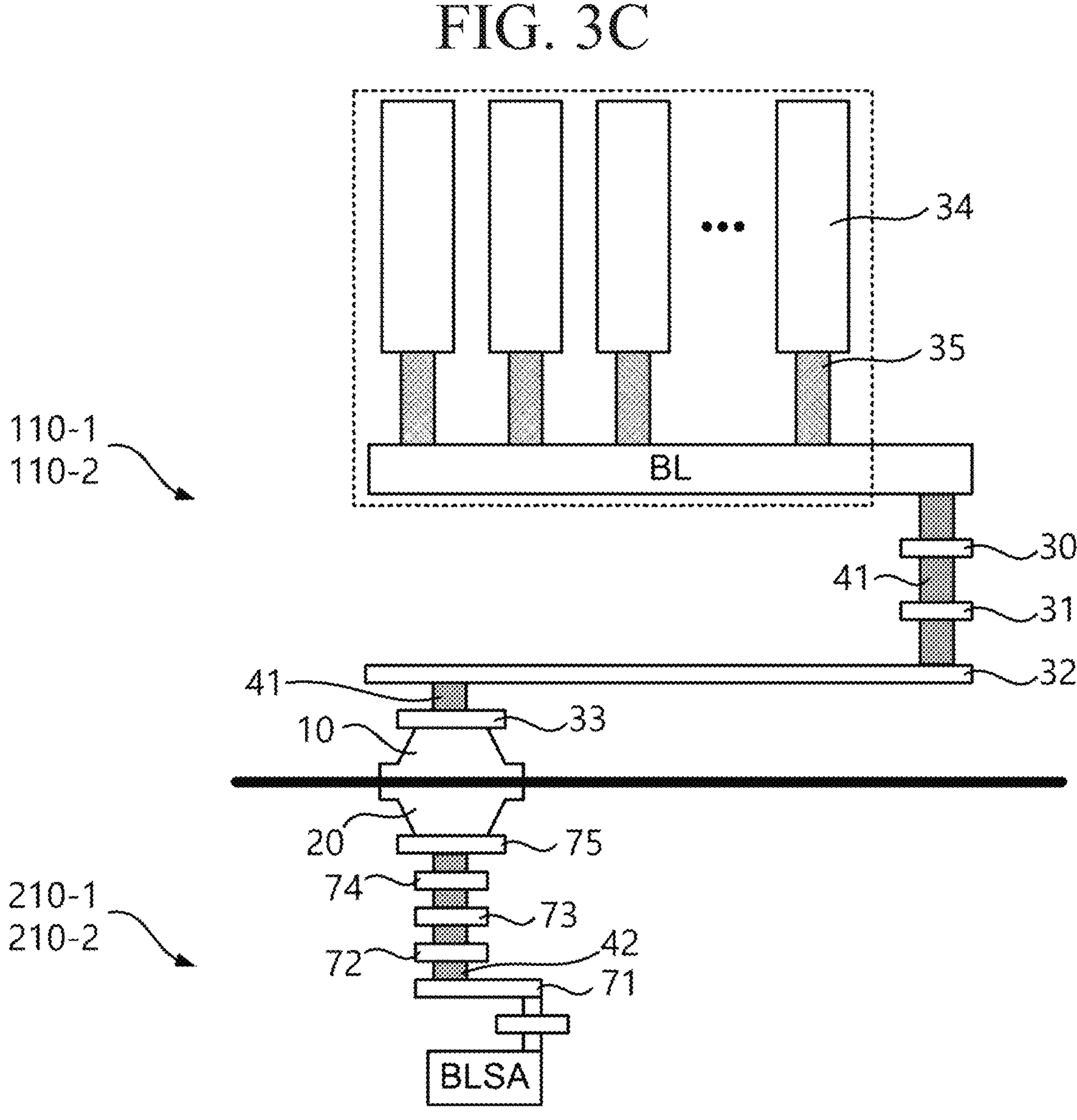
FIG. 3C is a view illustrating a section of a cell area and a core area of a semiconductor memory device according to an example embodiment.

FIG. 3C illustrates an example of a section of a cell area and a core area of the semiconductor memory device of FIG. 3A along a bit line. In describing FIG. 3C, repetitive descriptions identical to ones given with reference to FIGS. 3A and 3B will be omitted.

Referring to FIG. 3C, the core areas 210-1 and 210-2 may include bit line sense amplifiers BLSA disposed under the corresponding cell array mats. In an example embodiment, unlike the memory cells of the cell areas 110-1 and 110-2, the bit line sense amplifiers BLSA may be implemented using a horizontal channel transistor, but example embodiments are not limited thereto.

When the voltage of the bit line BL is changed by a memory cell connected to a selected word line, a signal corresponding to the voltage change may be transferred to the first bonding metal 10 through the plurality of metal layers 30, 31, 32, and 33 and the VIA 41. The signal transferred to the second chip 200B through the first and second bonding metals 10 and 20 may be applied to the bit line sense amplifier BLSA through the plurality of metal layers 71, 72, 73, 74, and 75 and the VIA 42.

Although examples of the sections of the cell areas 110-1 and 110-2 and the core areas 210-1 and 210-2 are illustrated in FIGS. 3B and 3C, each of the remaining area 120B and the peripheral area 220B may also include a plurality of metal layers. That is, the plurality of metal layers 30, 31, 32, and 33 included in the cell areas 110-1 and 110-2 may be included in the remaining area 120B, and the plurality of metal layers 71, 72, 73, 74, and 75 included in the core areas 210-1 and 210-2 may be included in the peripheral area 220B. According to an example embodiment, passive elements may be implemented using the plurality of metal layers 30, 31, 32, and 33 included in the remaining area 120B.

Hereinafter, various example embodiments in which passive elements are implemented using a plurality of metal layers included in a remaining area 120C of a first chip 100C will be described with reference to FIGS. 4A to 4D.

Figure 4A:
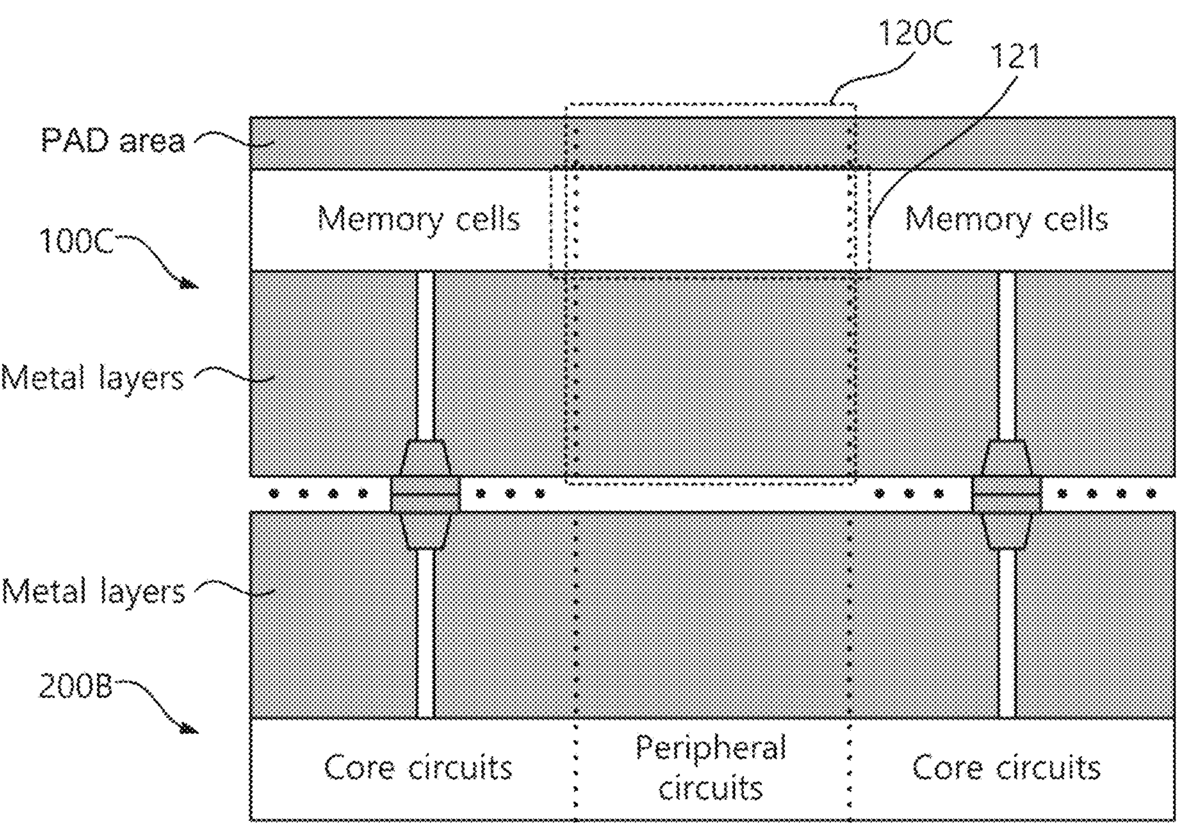
FIG. 4A is a view of a configuration of a semiconductor memory device according to an example embodiment.

FIG. 4A is a view of a configuration of a semiconductor memory device according to an example embodiment as viewed in the direction A in FIG. 1. The semiconductor memory device 1000C may be an example of the semiconductor memory devices 1000, 1000A, and 1000B of FIGS. 1, 2B, and 3A. However, example embodiments are not limited thereto.

Referring to FIG. 4A, the semiconductor memory device 1000C may include the first chip 100C and a second chip 200B. The semiconductor memory device 1000C is similar to the semiconductor memory device 1000B of FIG. 3A, differing only in that the first chip 100C further includes a pad area disposed at the top of the first chip 100C.

The first chip 100C may include the pad area. The pad area may be an area where pads which provide an electrical connection with an external device are formed. As illustrated, the pad area may be formed at the top of the first chip 100C, but example embodiments are not limited thereto. The pad area may include a redistribution layer RDL. The redistribution layer RDL may be a metal layer for rearranging the pads formed in the pad area. In an example embodiment, the redistribution layer RDL may be implemented with a material, such as copper or aluminum, which has a relatively low unit resistance. However, example embodiments are not limited thereto.

Accordingly, the first chip 100C may include lower metal layers formed under memory cells and the redistribution layer RDL formed on the memory cells. The lower metal layers may include the plurality of metal layers 30, 31, 32, and 33 described above with reference to FIGS. 3A to 3C. In addition, the redistribution layer RDL may be a metal layer included in the pad area.

According to an example embodiment, in the remaining area 120C of the first chip 100C, passive elements may be implemented using at least one metal layer among the lower metal layers 30, 31, 32, and 33 and the redistribution layer RDL.

Hereinafter, example embodiments in which the redistribution layer RDL and the first and second metal layers 30 and 31 are copper layers, the third and fourth metal layers 32 and 33 are tungsten layers, and passive elements are implemented in the remaining area 120C will be described. However, this is only an example, and example embodiments are not limited thereto.

Figure 4B:
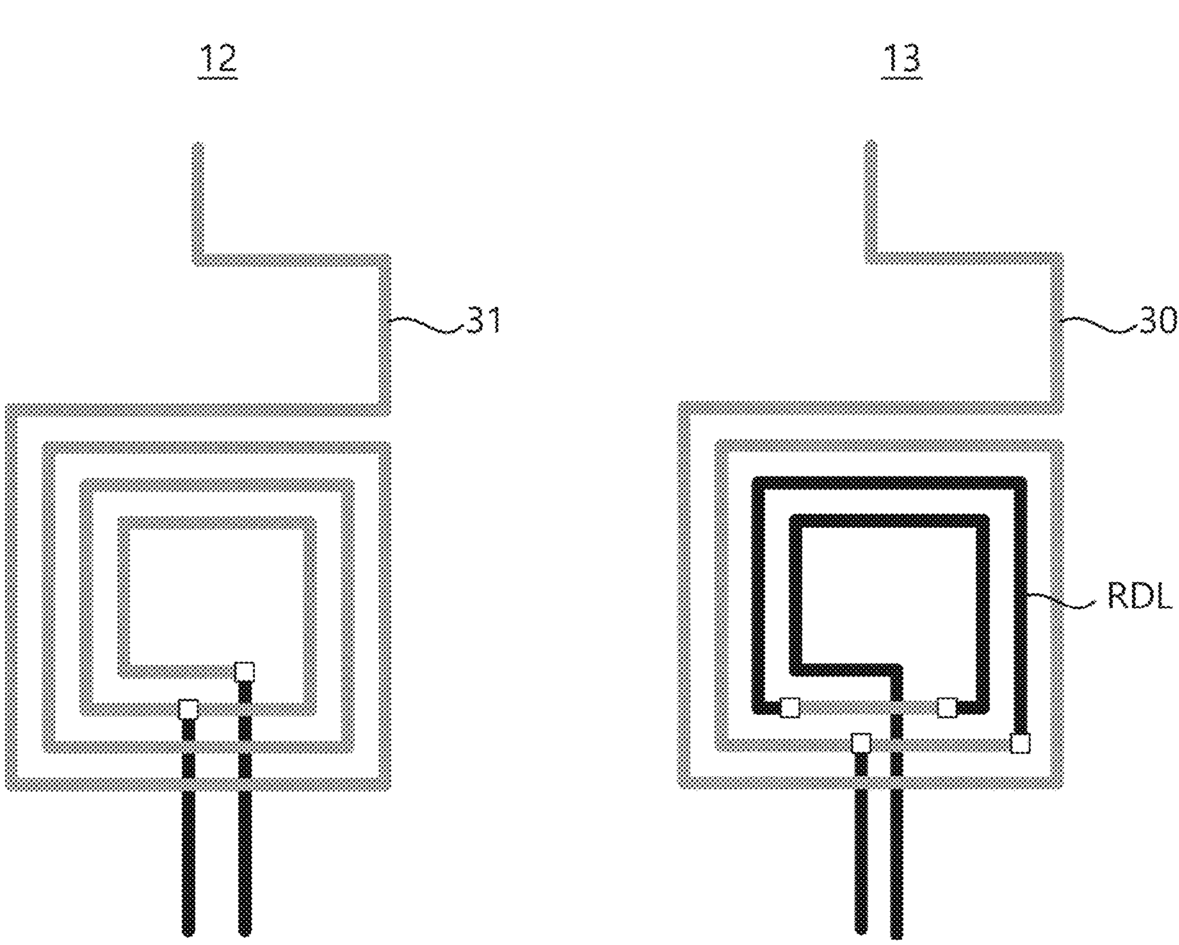
FIG. 4B is a view for explaining implementation of an inductor according to an example embodiment.

FIG. 4B is a view for explaining implementation of an inductor according to an example embodiment. FIG. 4B illustrates examples of an on-chip inductor (that is, a T-coil) implemented using a metal layer in the remaining area 120C.

As described above, the first chip 100C may include the lower metal layers 30, 31, 32, and 33 and the redistribution layer RDL. According to an example embodiment, at least one metal layer among the metal layers included in the remaining area 120C may be subjected to patterning to implement on-chip inductors 12 and 13 illustrated in FIG. 4B.

The inductors 12 and 13 may be implemented using a metal layer formed of a material having a relatively low unit resistance. In an example embodiment, the inductors 12 and 13 may be implemented using at least one of metal layers (e.g., the redistribution layer RDL, the first metal layer 30, and the second metal layer 31) that are formed of copper having a lower unit resistance than tungsten. However, example embodiments are not limited thereto.

As described above, according to example embodiments, an on-chip inductor having a required magnitude of inductance may be implemented in the remaining area 120C without an increase in chip size.

Figure 4C:
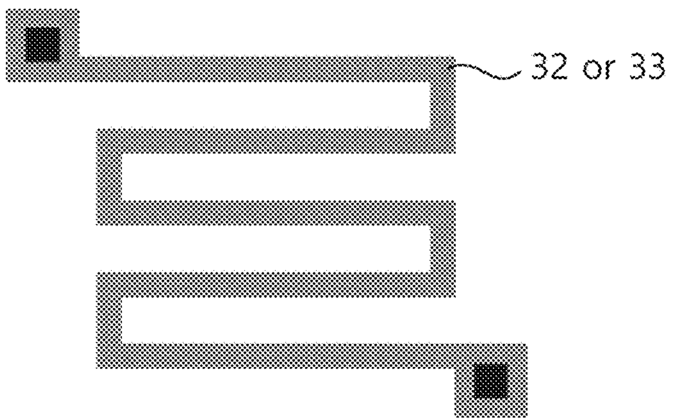
FIG. 4C is a view for explaining implementation of a resistor according to an example embodiment.

FIG. 4C is a view for explaining implementation of a resistor according to an example embodiment. FIG. 4C illustrates an example of an on-chip resistor implemented using a metal layer in the remaining area 120C.

According to an example embodiment, at least one metal layer among the metal layers included in the remaining area 120C may be subjected to patterning to implement a resistor 14 illustrated in FIG. 4C.

The resistor 14 may be implemented using a metal layer formed of a material having a relatively high unit resistance. In an example embodiment, the resistor 14 may be implemented using at least one of metal layers (e.g., the third metal layer 32 and the fourth metal layer 33) that are formed of tungsten having a higher unit resistance than copper. However, example embodiments are not limited thereto.

As described above, according to example embodiments, an on-chip resistor having a required magnitude of resistance may be implemented in the remaining area 120C without an increase in chip size.

Figure 4D:
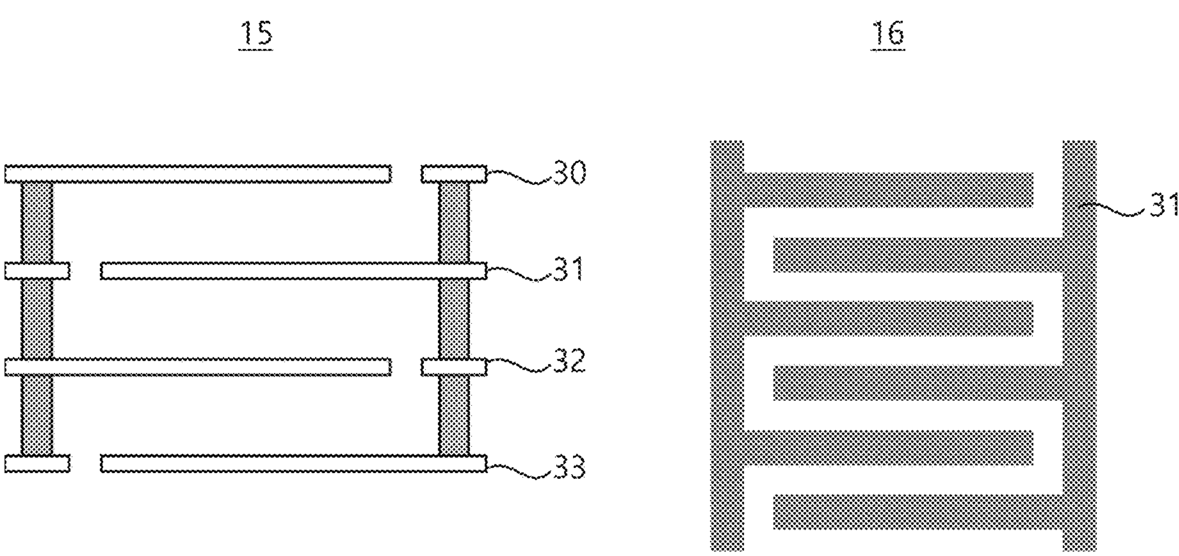
FIG. 4D is a view for explaining implementation of a capacitor according to an example embodiment.

FIG. 4D is a view for explaining implementation of a capacitor according to an example embodiment. FIG. 4D illustrates examples of an on-chip capacitor implemented using a metal layer in the remaining area 120C.

According to an example embodiment, capacitors 15 and 16 illustrated in FIG. 4D may be implemented using at least one metal layer among the metal layers included in the remaining area 120C.

The capacitor included in the remaining area 120C may include at least one of the metal-insulator-metal (MIM) capacitor 15 or the metal-oxide-metal (MOM) capacitor 16. The MIM capacitor 15 may be a capacitor formed using the different metal layers 30, 31, 32, and 33 and a dielectric therebetween. The MOM capacitor 16 may be a capacitor formed using the same metal layer (e.g., the second metal layer 31). However, example embodiments are not limited thereto.

As described above, according to example embodiments, an on-chip capacitor having a required magnitude of capacitance may be implemented in the remaining area 120C without an increase in chip size.

Although it has been described that the passive elements are implemented using the lower metal layers and the redistribution layer RDL of the first chip 100C, example embodiments are not limited thereto. For example, an area 121 having the same level as the memory cells may exist in the remaining area 120C, and a gate material layer and a source/drain material layer constituting a transistor of a memory cell may exist in the corresponding area 121. In some example embodiments, passive elements may be implemented using the gate material layer or the source/drain material layer.

Hereinafter, various example embodiments in which passive elements are implemented using dummy elements included in a remaining area 120C of a first chip 100D will be described with reference to FIGS. 5A to 5C.

Figure 5A:
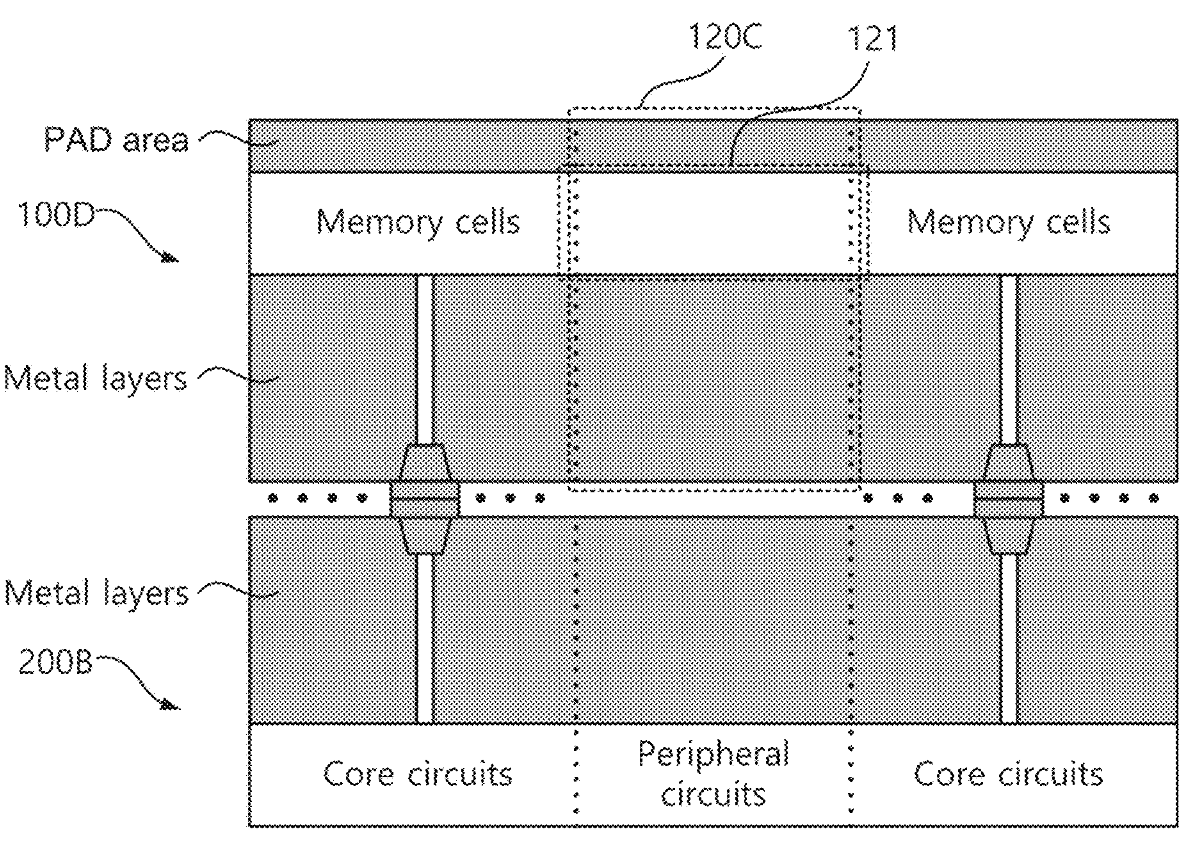
FIG. 5A is a view of a configuration of a semiconductor memory device according to an example embodiment.

FIG. 5A is a view of a configuration of a semiconductor memory device according to an example embodiment as viewed in the direction A in FIG. 1. The semiconductor memory device 1000D may be an example of the semiconductor memory devices 1000, 1000A, 1000B, and 1000C of FIGS. 1, 2B, 3A, and 4A. However, example embodiments are not limited thereto.

Referring to FIG. 5A, the semiconductor memory device 1000D may include the first chip 100D and a second chip 200B. The semiconductor memory device 1000D is similar to the semiconductor memory device 1000C of FIG. 4A, differing only in that passive elements using dummy cell transistors and/or dummy cell capacitors are implemented in an area 121 of the remaining area 120C of the first chip 100D. Therefore, detailed descriptions of identical contents will be omitted.

Specifically, dummy cells may be included in the remaining area 120C of the first chip 100D. Unlike memory cells included in cell areas 110-1 and 110-2, the dummy cells are not used to store data. For example, the dummy cells may include dummy cell transistors and/or dummy cell capacitors, and may be used to implement an on-chip resistor or an on-chip capacitor as will be described below. According to an example embodiment, the dummy cells may be formed together in the area 121 of the remaining area 120C when the memory cells are formed in the cell areas 110-1 and 110-2, but example embodiments are not limited thereto.

Figures 5B, 5C:
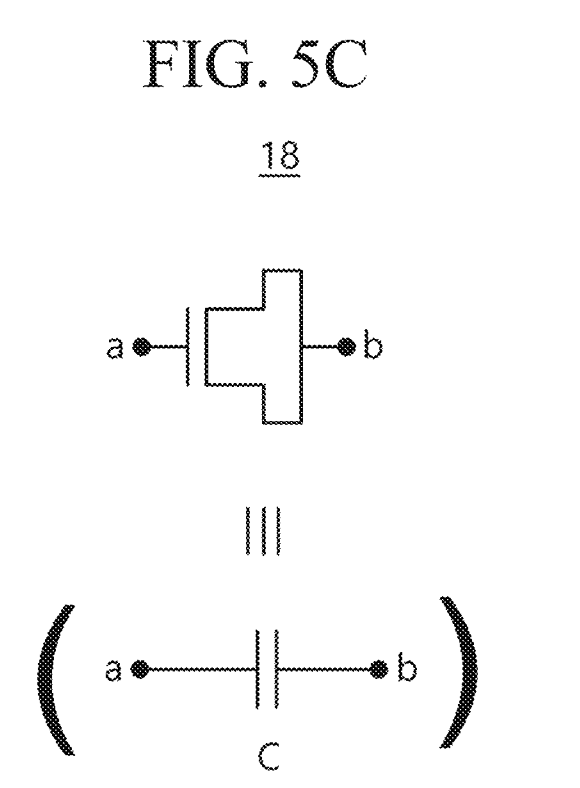
FIG. 5B is a view for explaining implementation of a resistor according to an example embodiment.
FIG. 5C is a view for explaining implementation of a capacitor according to an example embodiment.

FIG. 5B is a view for explaining implementation of a resistor according to an example embodiment. A metal oxide semiconductor (MOS) transistor is turned on and a channel is formed between a drain and a source when a voltage higher than or equal to a threshold voltage is applied to a gate. While the MOS transistor is turned on, a resistance (i.e., an on-resistance) may exist between the drain and the source, and an on-chip resistor may be implemented using the on-resistance characteristics of the MOS transistor.

FIG. 5B illustrates an example of an on-chip resistor 17 implemented using the on-resistance characteristics of the MOS transistor. According to an example embodiment, a plurality of dummy cell transistors may be formed in the area 121 of the remaining area 120C. The transistors illustrated in FIG. 5B represent the dummy cell transistors formed in the remaining area 120C. Referring to FIG. 5B, at least some of the plurality of dummy cell transistors may be connected in series, and a certain bias voltage (e.g., a voltage V higher than or equal to the threshold voltage) may be applied to gate terminals of the dummy cell transistors connected in series. Accordingly, an on-chip resistor having a desired resistance value may be implemented in the remaining area 120C.

As described above, according to example embodiments, an on-chip resistor having a required magnitude of resistance may be implemented in the remaining area 120C without an increase in chip size.

FIG. 5C is a view for explaining implementation of a capacitor according to an example embodiment. For example, a MOS capacitor may be implemented by connecting a drain and a source of a MOS transistor.

FIG. 5C illustrates an example of an on-chip capacitor implemented in the form of a MOS capacitor. The transistor illustrated in FIG. 5C represents a dummy cell transistor formed in the remaining area 120C. Referring to FIG. 5C, a MOS capacitor 18 may be implemented in the remaining area 120C by connecting a drain and a source of the dummy cell transistor. Although the MOS capacitor using one dummy cell transistor is illustrated in FIG. 5C, example embodiments are not limited thereto. For example, an on-chip capacitor having a desired capacitance value may be implemented in the remaining area 120C by merging a plurality of MOS capacitors using a plurality of dummy cell transistors.

According to an example embodiment, a plurality of dummy cell capacitors may be formed in the area 121 of the remaining area 120C. Accordingly, according to an example embodiment, an on-chip capacitor having a desired capacitance value may be implemented in the remaining area 120C by using the plurality of dummy cell capacitors.

As described above, according to example embodiments, an on-chip capacitor having a required magnitude of capacitance may be implemented in the remaining area 120C without an increase in chip size.

Figure 6A:
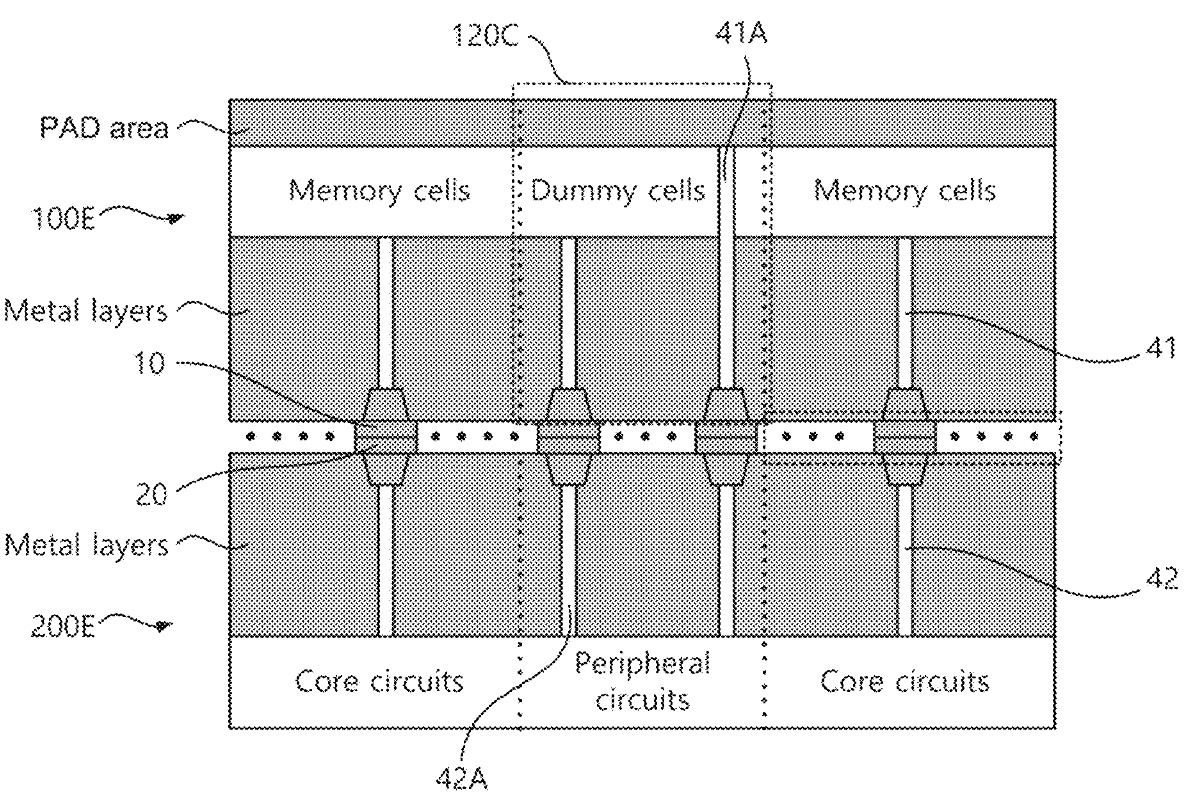
FIG. 6A is a view of a configuration of a semiconductor memory device according to an example embodiment.

FIG. 6A is a view of a configuration of a semiconductor memory device according to an example embodiment as viewed in the direction A in FIG. 1. The semiconductor memory device 1000E may be an example of the semiconductor memory devices 1000, 1000A, 1000B, 1000C, and 1000D of FIGS. 1, 2B, 3A, 4A, and 5A. However, example embodiments are not limited thereto. In describing FIG. 6A, repetitive descriptions identical to ones given above will be omitted.

Referring to FIG. 6A, the semiconductor memory device 1000E may include a first chip 100E and a second chip 200E. The first chip 100E may include, in a remaining area 120C, VIAs 41A connected with first bonding metals 10. In addition, the second chip 200E may include VIAs 42A connected with second bonding metals 20.

Accordingly, as described above, passive elements formed in the remaining area 120C of the first chip 100E through various methods may be connected with peripheral circuits through the VIAs 41A formed in the first chip 100E, the first and second bonding metals 10 and 20, and the VIAs 42A formed in the second chip 200E.

Figure 6B:
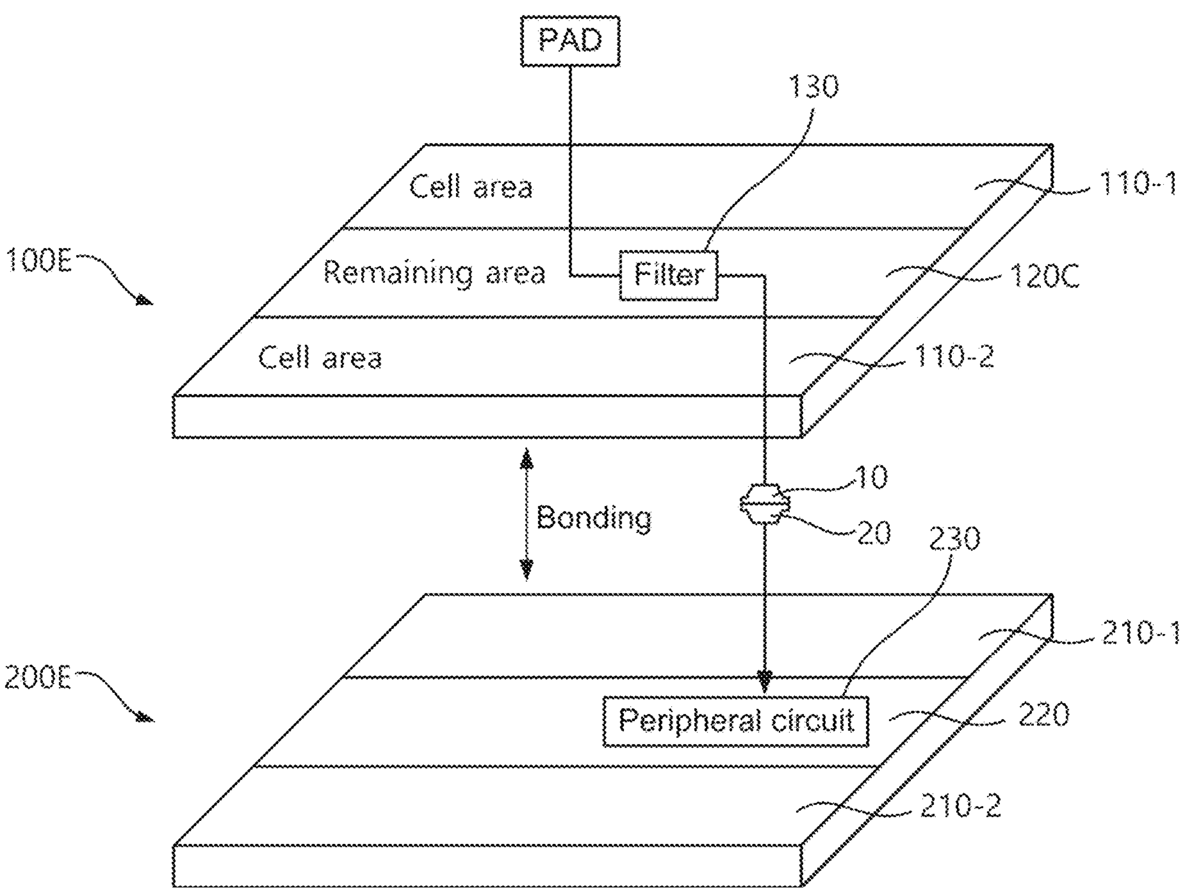
FIG. 6B is a view illustrating a configuration of a semiconductor memory device according to an example embodiment.

FIG. 6B is a view illustrating a configuration of a semiconductor memory device according to an example embodiment. The semiconductor memory device 1000E' may be an example of the semiconductor memory devices 1000, 1000A, 1000B, 1000C, 1000D, and 1000E of FIGS. 1, 2B, 3A, 4A, 5A, and 6A. However, example embodiments are not limited thereto. In describing FIG. 6B, repetitive descriptions identical to ones given above will be omitted.

Referring to FIG. 6B, the semiconductor memory device 1000E' may include a first chip 100E and a second chip 200E. A remaining area 120C of the first chip 100E may include passive elements implemented as described above. According to an example embodiment, the remaining area 120C may include a filter 130 formed by a combination of the passive elements. For example, various filters 130, such as a low-pass filter, a high-pass filter, a band pass filter, a band stop filter, and the like, may be implemented by a combination of inductors, resistors, and capacitors formed in the remaining area 120C. The implemented filters 130 may be formed in the remaining area 120C.

The filter 130 may filter a signal applied through a pad PAD. The signal filtered through the filter 130 may be applied to a peripheral circuit 230 included in a peripheral area 220 through first and second bonding metals 10 and 20. The peripheral circuit 230 connected with the filter 130 may be, for example, an I/O circuit, a DC circuit, or the like, but example embodiments are not limited thereto.

As described above, according to an example embodiment, various filters for improving the operating characteristics of peripheral circuits may be implemented without an increase in chip size by a combination of passive elements in the remaining area 120C.

Figure 6C:
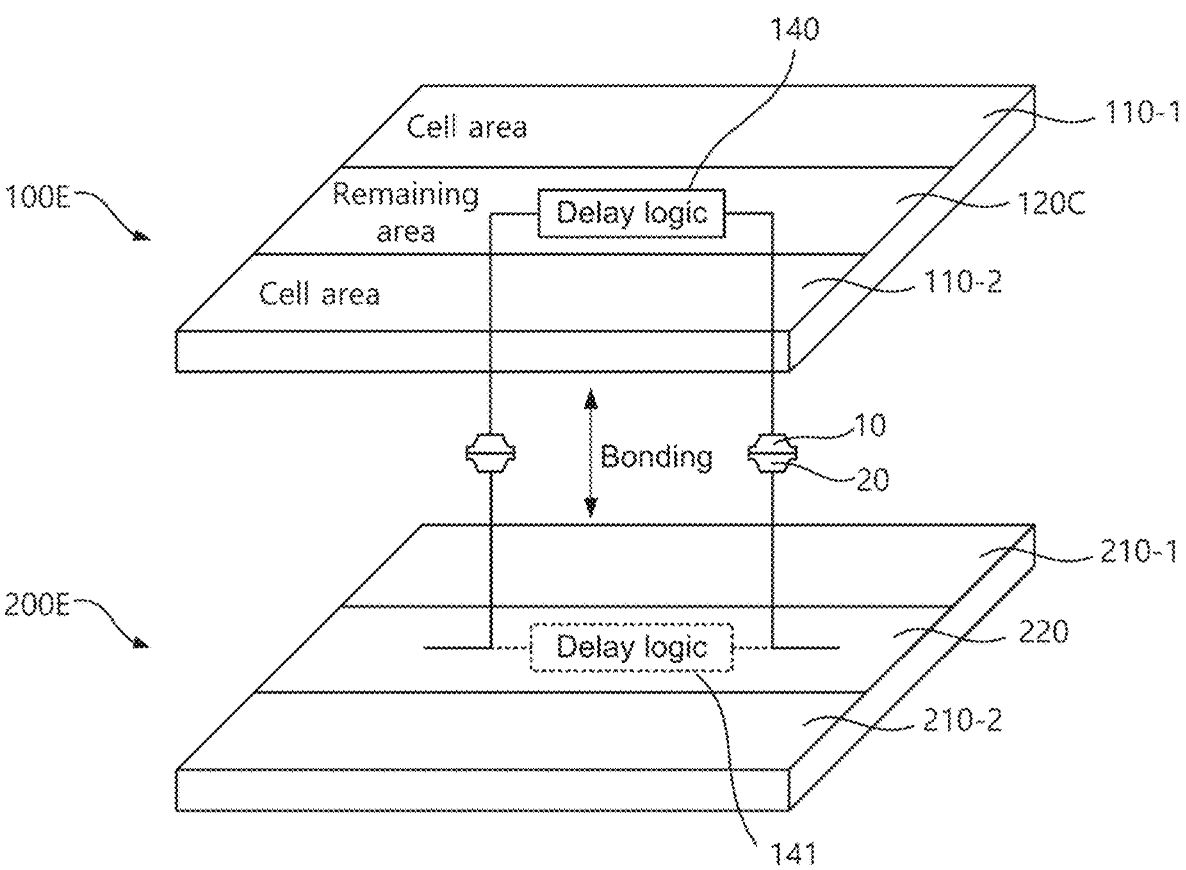
FIG. 6C is a view illustrating a configuration of a semiconductor memory device according to an example embodiment.

FIG. 6C is a view illustrating a configuration of a semiconductor memory device according to an example embodiment. The semiconductor memory device 1000E" may be an example of the semiconductor memory devices 1000, 1000A, 1000B, 1000C, 1000D, 1000E, and 1000E' of FIGS. 1, 2B, 3A, 4A, 5A, 6A, and 6B. However, example embodiments are not limited thereto. In describing FIG. 6C, repetitive descriptions identical to ones given above will be omitted.

Referring to FIG. 6C, the semiconductor memory device 1000E" may include a first chip 100E and a second chip 200E. A remaining area 120C of the first chip 100E may include passive elements implemented as described above. According to an example embodiment, the remaining area 120C may include delay logic 140 formed by a combination of the passive elements. For example, various types of delay logic 140 required for operation of peripheral circuits may be implemented by a combination of resistors and capacitors formed in the remaining area 120C, and the implemented delay logic 140 may be formed in the remaining area 120C.

Among peripheral circuits in a peripheral area 220, there are peripheral circuits (e.g., a delayed locked loop (DLL)) that require delay logic. According to an example embodiment, these peripheral circuits may operate using the delay logic 140 formed in the remaining area 120C. That is, according to an example embodiment, delay logic 141 implemented in the peripheral area 220 together with the peripheral circuits may be replaced with the delay logic 140 implemented in the remaining area 120C. Accordingly, a chip size of the semiconductor memory device may be reduced.

Figure 7:
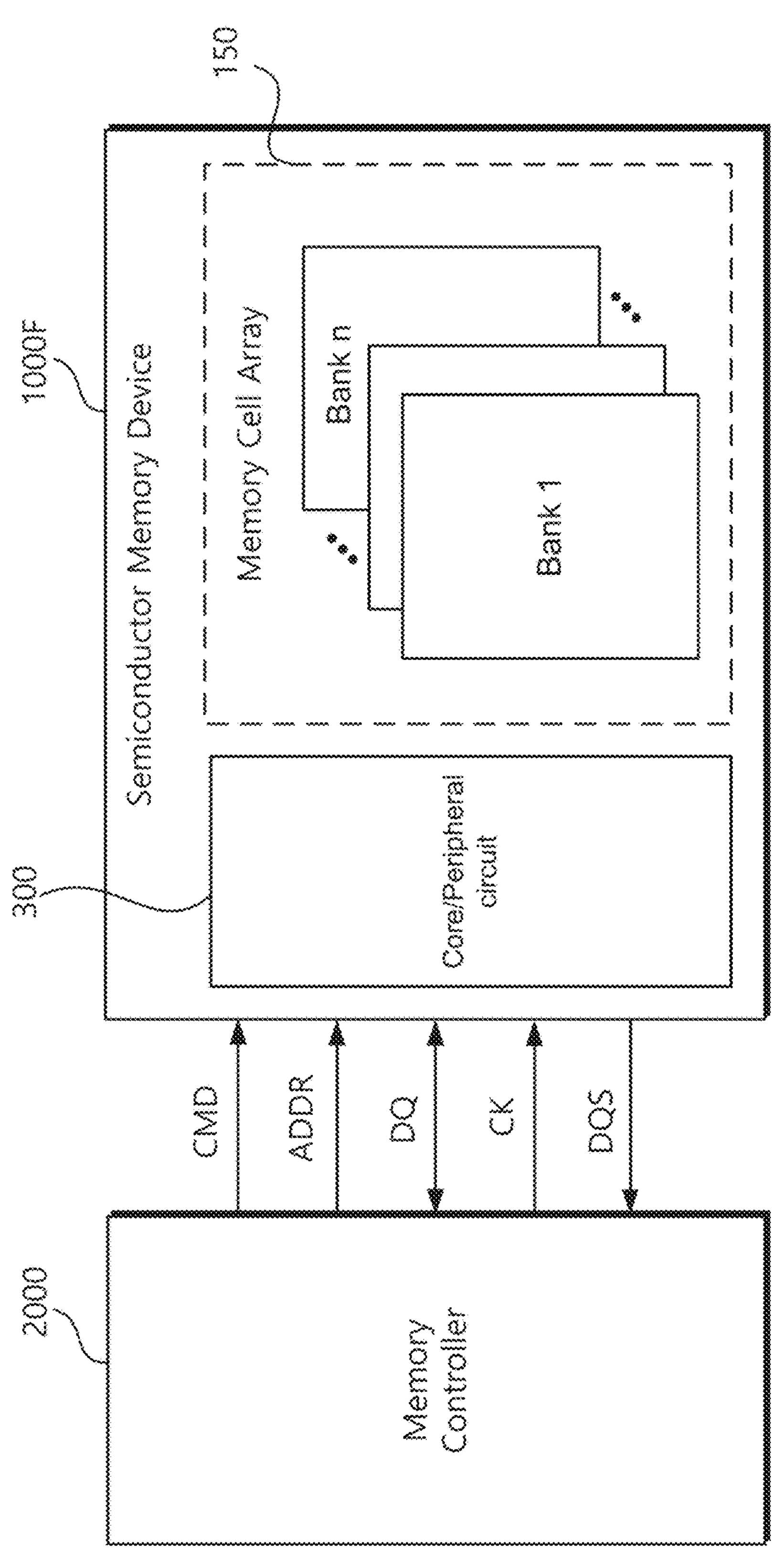
FIG. 7 is a block diagram illustrating a configuration of a semiconductor memory system according to an example embodiment.

FIG. 7 is a block diagram illustrating a configuration of a semiconductor memory system according to an example embodiment. Referring to FIG. 7, the semiconductor memory system 10000 may include a memory controller 2000 and a semiconductor memory device 1000F. The semiconductor memory device 1000F may be an example of the semiconductor memory devices 1000, 1000A, 1000B, 1000C, 1000D, 1000E, 1000E', and 1000E" of FIGS. 1, 2B, 3A, 4A, 5A, 6A, 6B, and 6C. However, example embodiments are not limited thereto. In describing FIG. 7, repetitive descriptions identical to ones given above will be omitted.

The memory controller 2000 may control the semiconductor memory device 1000F. For example, the memory controller 2000 may control the semiconductor memory device 1000F in response to a request of a processor that supports various applications such as a server application, a personal computer (PC) application, a mobile application, and the like. For example, the memory controller 2000 may be included in a host including the processor and may control the semiconductor memory device 1000F in response to the request of the processor.

The memory controller 2000 may transmit a clock signal CK, a command CMD, and/or an address ADDR to the semiconductor memory device 1000F to control the semiconductor memory device 1000F. In addition, the memory controller 2000 may transmit a data signal DQ to the semiconductor memory device 1000F, or may receive the data signal DQ from the semiconductor memory device 1000F. The memory controller 2000 may receive a data strobe signal DQS from the semiconductor memory device 1000F when reading the data signal DQ from the semiconductor memory device 1000F.

The semiconductor memory device 1000F may receive data from the memory controller 2000 and may store the received data. The semiconductor memory device 1000F may read the stored data in response to a request of the memory controller 2000 and may transmit the data to the memory controller 2000.

In an example embodiment, the semiconductor memory device 1000F may be a semiconductor memory device including volatile memory cells. For example, the semiconductor memory device 1000F may include various DRAM devices such as double data rate synchronous dynamic random access memory (DDR SDRAM), DDR2 SDRAM, DDR3 SDRAM, DDR4 SDRAM, DDR5 SDRAM, DDR6 SDRAM, low power double data rate (LPDDR) SDRAM, LPDDR2 SDRAM, LPDDR3 SDRAM, LPDDR4 SDRAM, LPDDR4X SDRAM, LPDDR5 SDRAM, graphics double data rate synchronous graphics random access memory (GDDR SGRAM), GDDR2 SGRAM, GDDR3 SGRAM, GDDR4 SGRAM, GDDR5 SGRAM, GDDR6 SGRAM, and the like.

In an example embodiment, the semiconductor memory device 1000F may be a memory device, such as high bandwidth memory (HBM), HBM2, HBM3, or the like, in which DRAM dies are stacked.

In an example embodiment, the semiconductor memory device 1000F may be a memory module such as a dual in-line memory module (DIMM). For example, the semiconductor memory device 1000F may be a registered DIMM (RDIMM), a load reduced DIMM (LRDIMM), an unbuffered DIMM (UDIMM), a fully buffered DIMM (FB-DIMM), or a small outline DIMM (SO-DIMM). However, these are illustrative, and the semiconductor memory device 1000F may be another memory module such as a single in-line memory module (SIMM).

In an example embodiment, the semiconductor memory device 1000F may include an SRAM device, a NAND flash memory device, a NOR flash memory device, an RRAM device, an FRAM device, a PRAM device, a TRAM device, an MRAM device, or the like.

The semiconductor memory device 1000F may include a memory cell array 150 and a core/peripheral circuit 300. The memory cell array 150 may be implemented in the above-described first chips 100, 100A, 100B, 100C, 100D, and 100E, and the core/peripheral circuit 300 may be implemented in the above-described second chips 200, 200A, 200B, and 200E.

The memory cell array 150 may include a plurality of banks Bank 1 to Bank n, and each of the banks may include memory cells for storing data. For convenience of description, it will be assumed that each bank includes DRAM cells. However, this is illustrative, and each of the plurality of banks Bank 1 to Bank n may be implemented to include volatile memory cells other than the DRAM cells. In addition, each of the plurality of banks Bank 1 to Bank n may be implemented to include the same type of memory cells, or may be implemented to include different types of memory cells.

According to an example embodiment, each of the plurality of banks Bank 1 to Bank n may include a plurality of cell array mats. The cell array mats may refer to memory cell areas divided from one another and controlled based on different sub-word line drivers.

The core/peripheral circuit 300 may include various circuits for driving the memory cell array 150. For example, the core/peripheral circuit 300 may include various core circuits such as a bit line sense amplifier, a sub-word line driver, a row decoder (or, an X-decoder), a column decoder (or, a Y-decoder), and the like. The core circuits may be disposed in the above-described core areas 210-1 and 210-2. In addition, the core/peripheral circuit 300 may include various peripheral circuits such as control logic for decoding commands, an address buffer, a delayed locked loop (DLL), a data I/O circuit (that is, an I/O circuit), a power circuit (that is, a DC circuit), and the like. The peripheral circuits may be disposed in the above-described peripheral areas 220, 220A, and 220B.

Figure 8:
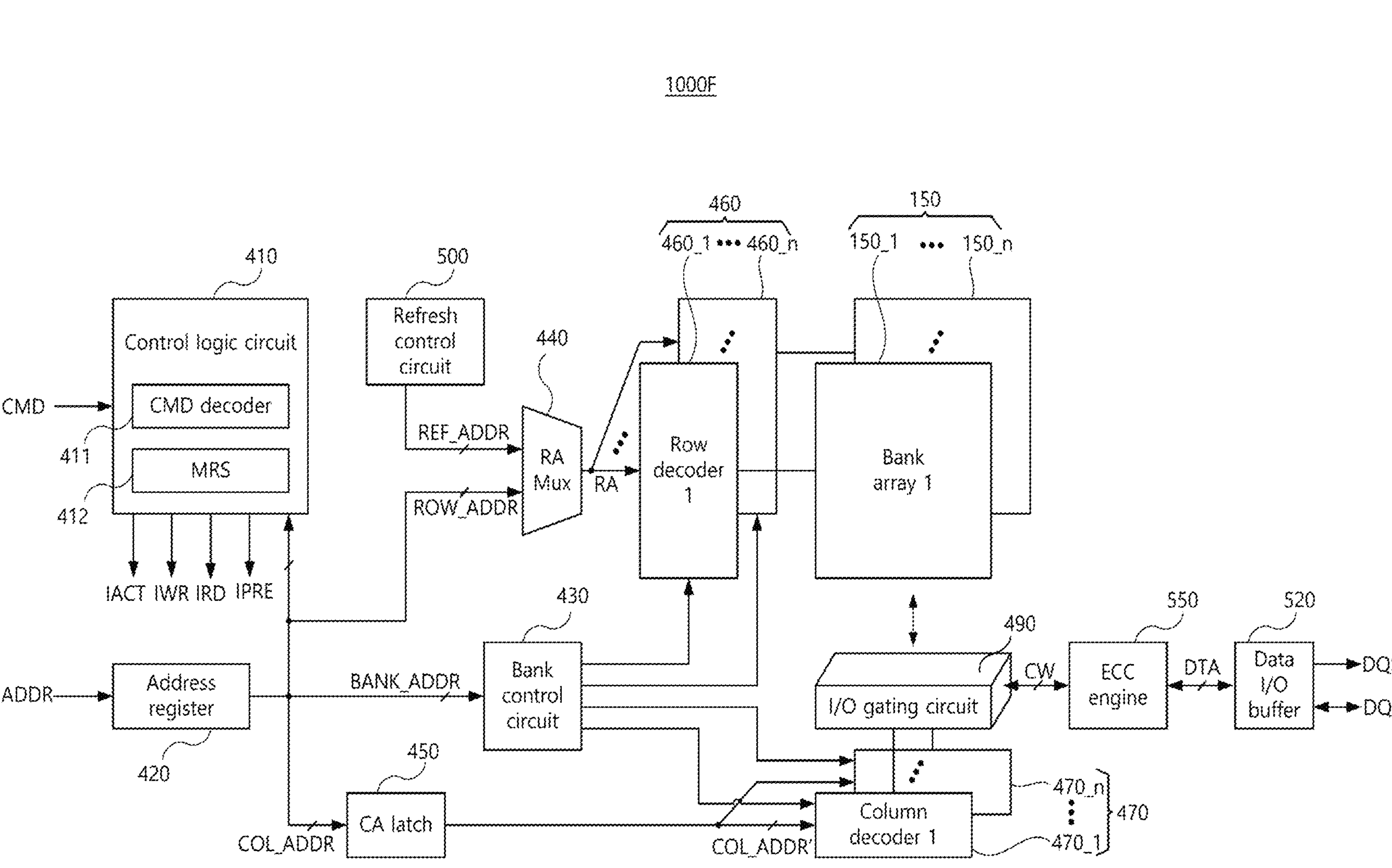
FIG. 8 is a block diagram illustrating a configuration of a semiconductor memory device according to an example embodiment.

FIG. 8 is a block diagram illustrating a configuration of a semiconductor memory device according to an example embodiment. The semiconductor memory device 1000F may be an example of the semiconductor memory device 1000F of FIG. 7. However, example embodiments are not limited thereto.

Referring to FIG. 8, the semiconductor memory device 1000F may include a control logic circuit 410, an address register 420, bank control logic 430, a refresh control circuit 500, a row address multiplexer 440, a column address latch 450, a row decoder 460, a column decoder 470, a memory cell array 150, an I/O gating circuit 490, an ECC engine 550, and a data I/O buffer 520. According to example embodiments, the semiconductor memory device 1000F may include a sub-word line driver and a bit line sense amplifier that correspond to each cell array mat.

According to an example embodiment, the memory cell array 150 may be implemented in the above-described first chips 100, 100A, 100B, 100C, 100D, and 100E. In addition, the remaining circuits 410, 420, 430, 440, 450, 460, 470, 490, 500, 520, and 550, the sub-word line drivers, and the bit line sense amplifiers may be implemented in the above-described second chips 200, 200A, 200B, and 200E.

For example, core circuits including the sub-word line drivers, the bit line sense amplifiers, the row decoder 460, and the column decoder 470 may be disposed in the core areas 210-1 and 210-2 of the second chips 200, 200A, 200B, and 200E. In addition, peripheral circuits including the control logic circuit 410, the address register 420, the bank control logic 430, the refresh control circuit 500, the row address multiplexer 440, the column address latch 450, the I/O gating circuit 490, the ECC engine 550, and the data I/O buffer 520 may be disposed in the peripheral areas 220, 220A, and 220B of the second chips 200, 200A, 200B, and 200E.

In an example embodiment, referring to FIGS. 2B and 8 together, the sub-word line drivers and the bit line sense amplifiers may be disposed in the first area 201 of the core areas 210-1 and 210-2. Furthermore, the row decoder 460 may be disposed in the second area 26 of the core areas 210-1 and 210-2, and the column decoder 470 may be disposed in the third area 27 of the core areas 210-1 and 210-2. In addition, the control logic circuit 410, the address register 420, the bank control logic 430, the refresh control circuit 500, the row address multiplexer 440, the column address latch 450, the I/O gating circuit 490, the ECC engine 550, and the data I/O buffer 520 may be disposed in the peripheral area 220A. However, example embodiments are not limited thereto.

The memory cell array 150 may include a plurality of bank arrays 150_1 to 150_*n*. Each of the plurality of bank arrays 150_1 to 150_*n* may include a plurality of memory cells. For example, each of the plurality of memory cells may be formed at the intersection of a corresponding word line and a corresponding bit line. Each of the plurality of bank arrays 150_1 to 150_*n* may include a plurality of cell array mats.

The row decoder 460 may include a plurality of sub-row decoders 460_1 to 460_*n*. Each of the plurality of sub-row decoders 460_1 to 460_*n* may be connected to a corresponding bank array among the plurality of bank arrays 150_1 to 150_*n*.

The column decoder 470 may include a plurality of sub-column decoders 470_1 to 470_*n*. Each of the plurality of sub-row decoders 470_1 to 470_*n* may be connected to a corresponding bank array among the plurality of bank arrays 150_1 to 150_*n*.

For example, the plurality of bank arrays 150_1 to 150_*n*, the plurality of sub-column decoders 470_1 to 470_*n*, and the plurality of sub-row decoders 460_1 to 460_*n* may constitute a plurality of banks. For example, the first bank array 150_1, the first sub-column decoder 470_1, and the first sub-row decoder 460_1 may constitute a first bank.

The address register 420 may receive, from the memory controller 2000, an address ADDR including a bank address BANK_ADDR, a row address ROW_ADDR, and a column address COL_ADDR. The address register 420 may provide the received bank address BANK_ADDR to the bank control logic 430, may provide the received row address ROW-_ADDR to the row address multiplexer 440, and may provide the received column address COL_ADDR to the column address latch 450.

The bank control logic 430 may generate bank control signals in response to the bank address BANK_ADDR. For example, in response to the bank control signals, a row decoder corresponding to the bank address BANK_ADDR among the plurality of sub-row decoders 460_1 to **460_*n* may be activated. In response to the bank control signals, a column decoder corresponding to the bank address BANK_ADDR among the plurality of sub-column decoders 470_1 to 470_*n*** may be activated.

The row address multiplexer 440 may receive the row address ROW_ADDR from the address register 420 and may receive a refresh row address REF_ADDR from the refresh control circuit 500. The row address multiplexer 440 may selectively output the row address ROW_ADDR or the refresh row address REF_ADDR as a row address RA. The row address RA output from the row address multiplexer 440 may be applied to the plurality of sub-row decoders 460_1 to **460_*n***.

The refresh control circuit 500 may sequentially increase or decrease the refresh row address REF_ADDR in response to refresh signals from the control logic circuit 410.

Among the plurality of sub-row decoders 460_1 to **460_*n*, a row decoder selected by the bank control logic 430 may activate a word line corresponding to the row address RA output from the row address multiplexer 440**. For example, the selected row decoder may apply a drive signal to the word line corresponding to the row address RA.

According to an example embodiment, the drive signal may be applied to a main word line corresponding to the row address. The drive signal applied to the main word line may be applied to sub-word line drivers for driving the word line corresponding to the row address. Accordingly, the word line corresponding to the relevant row address may be activated by the sub-word line drivers.

The column address latch 450 may receive the column address COL_ADDR from the address register 420 and may temporarily store the received column address COL_ADDR. In addition, for example, in a burst mode, the column address latch 450 may gradually increase the received column address COL_ADDR. The column address latch 450 may apply a temporarily stored or gradually increased column address COL_ADDR' to the plurality of sub-column decoders 470_1 to **470_*n***.

Among the plurality of sub-column decoders 470_1 to **470_*n*, a column decoder activated by the bank control logic 430 may activate a sense amplifier corresponding to the bank address BANK_ADDR and the column address COL_ADDR through the I/O gating circuit 490**.

The I/O gating circuit 490 may include circuits that gate I/O data. In addition, the I/O gating circuit 490 may include data latches for storing a code word CW output from the plurality of bank arrays 150_1 to **150_*n* and write drivers for writing data to the plurality of bank arrays 150_1 to 150_*n***.

In an example embodiment, during a read operation, a code word CW read out of a selected bank array among the plurality of bank arrays 150_1 to **150_*n* may be sensed by a sense amplifier corresponding to the selected bank array and may be stored in the data latches of the I/O gating circuit 490. In addition, the code word CW stored in the data latches may be ECC decoded by the ECC engine 550 and may be provided to the data I/O buffer 520 as data DTA. The data I/O buffer 520 may generate a data signal DQ based on the data DAT and may provide, to the memory controller 2000**, the data signal DQ together with a strobe signal DQS.

In an example embodiment, during a write operation, data DAT to be written to a selected bank array among the plurality of bank arrays 150_1 to **150_*n* may be received by the data I/O buffer 520 as a data signal DQ. The data I/O buffer 520 may convert the data signal DQ into the data DTA and may provide the data DTA to the ECC engine 550. The ECC engine 550 may generate parity bits (or, parity data) based on the data DTA and may provide a code word CW including the data DTA and the parity bits to the I/O gating circuit 490. The I/O gating circuit 490** may write the code word CW to the selected bank array.

In the write operation, the data I/O buffer 520 may convert the data signal DQ into the data DTA and may provide the data DTA to the ECC engine 550. In the read operation, the data I/O buffer 520 may convert the data DTA provided from the ECC engine 550 into the data signal DQ.

In the write operation, the ECC engine 550 may perform ECC encoding on the data DTA. In the read operation, the ECC engine 550 may perform ECC decoding on the code word CW.

The control logic circuit 410 may control an operation of the semiconductor memory device 1000F. For example, the control logic circuit 410 may generate control signals such that the semiconductor memory device 1000F performs a write operation, a read operation, and a refresh operation. The control logic circuit 410 may include a command decoder 411 that decodes a command CMD received from the memory controller 2000 and a mode register set MRS 412 for setting an operating mode of the semiconductor memory device 1000F.

The command decoder 411 may decode the command CMD and may generate internal command signals such as an internal active signal IACT, an internal precharge signal IPRE, an internal read signal IRD, an internal write signal IWR, and the like. In addition, the command decoder 411 may decode a chip selection signal and a command/address signal and may generate control signals corresponding to the command CMD.

Figure 9:
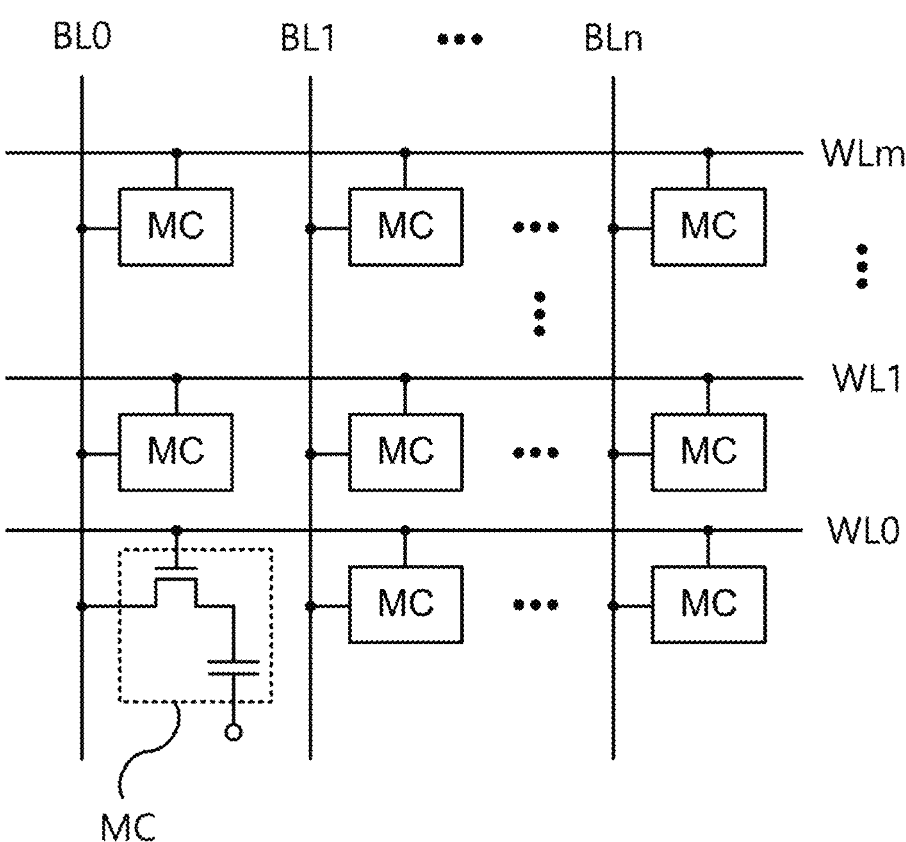
FIG. 9 is a view illustrating a configuration of a memory cell array according to an example embodiment.

FIG. 9 is a view illustrating a configuration of a memory cell array according to an example embodiment. Referring to FIG. 9, the memory cell array 900 may include a plurality of word lines WL0 to WLm, a plurality of bit lines BL0 to BLn, and a plurality of memory cells MCs disposed at the intersections of the word lines WL0 to WLm and the bit lines BL0 to BLn.

According to an example embodiment, each of the memory cells MC may be a DRAM cell. For example, each of the memory cells MC may include a cell transistor connected to a word line and a bit line and a cell capacitor connected to the cell transistor. According to an example embodiment, the cell transistor may be a vertical channel transistor.

Because a vertical channel transistor has a structure different from that of a horizontal channel transistor, the vertical channel transistor and the horizontal channel transistor may be implemented using different wafers. According to an example embodiment, each memory cell may be implemented using a vertical transistor. In addition, core circuits or peripheral circuits may be implemented using horizontal transistors.

According to an example embodiment, the memory cells included in the memory cell array 900 may be implemented in the first chip 100 including vertical channel transistors, and the core circuits or the peripheral circuits may be implemented in the second chip 200 including horizontal channel transistors. Accordingly, the semiconductor memory device 1000 having a CoP structure may be implemented by bonding the first chip 100 and the second chip 200.

Figure 10A:
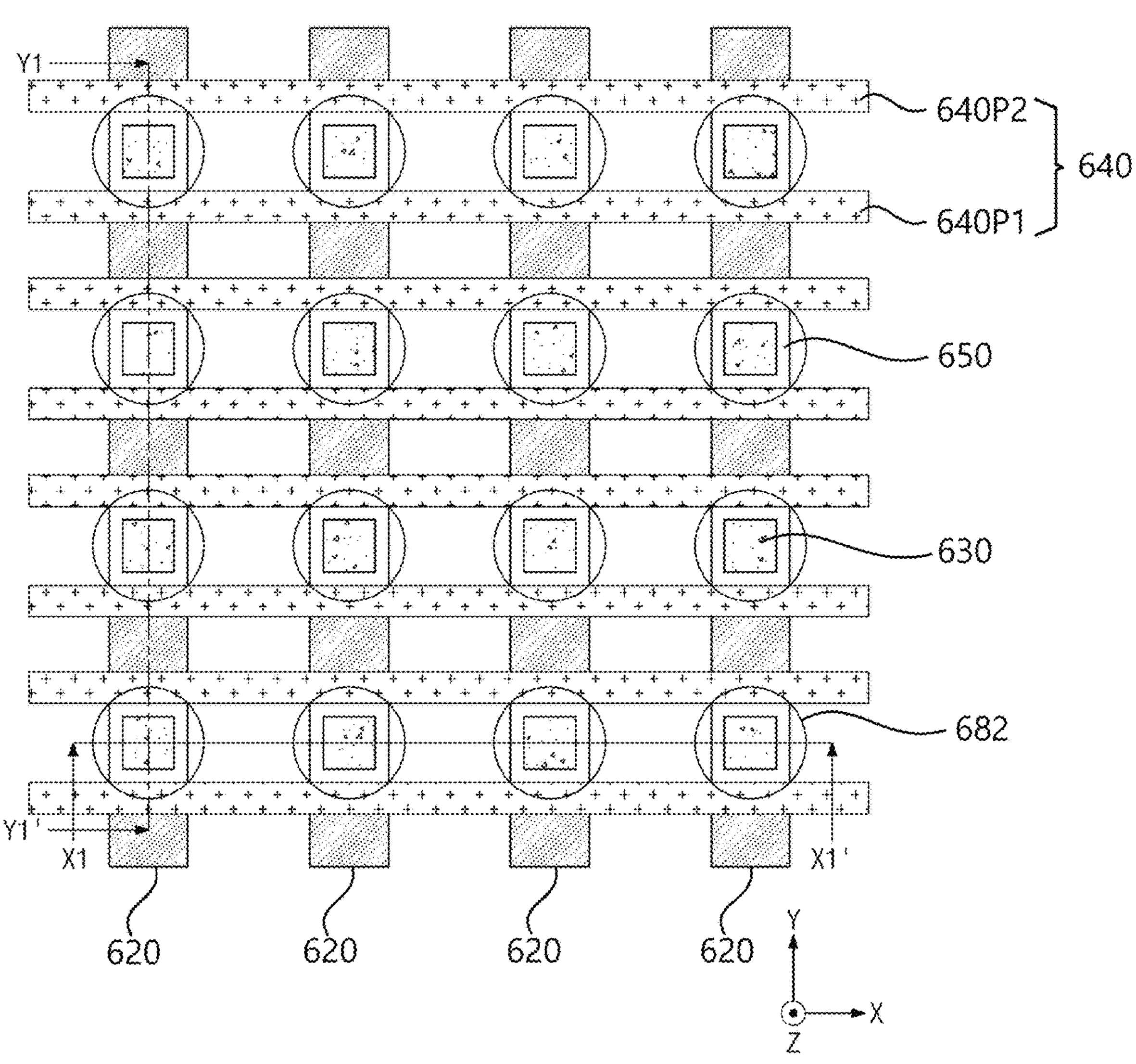
FIG. 10A is a view illustrating the layout of a memory cell array according to an example embodiment.
Figure 10B:
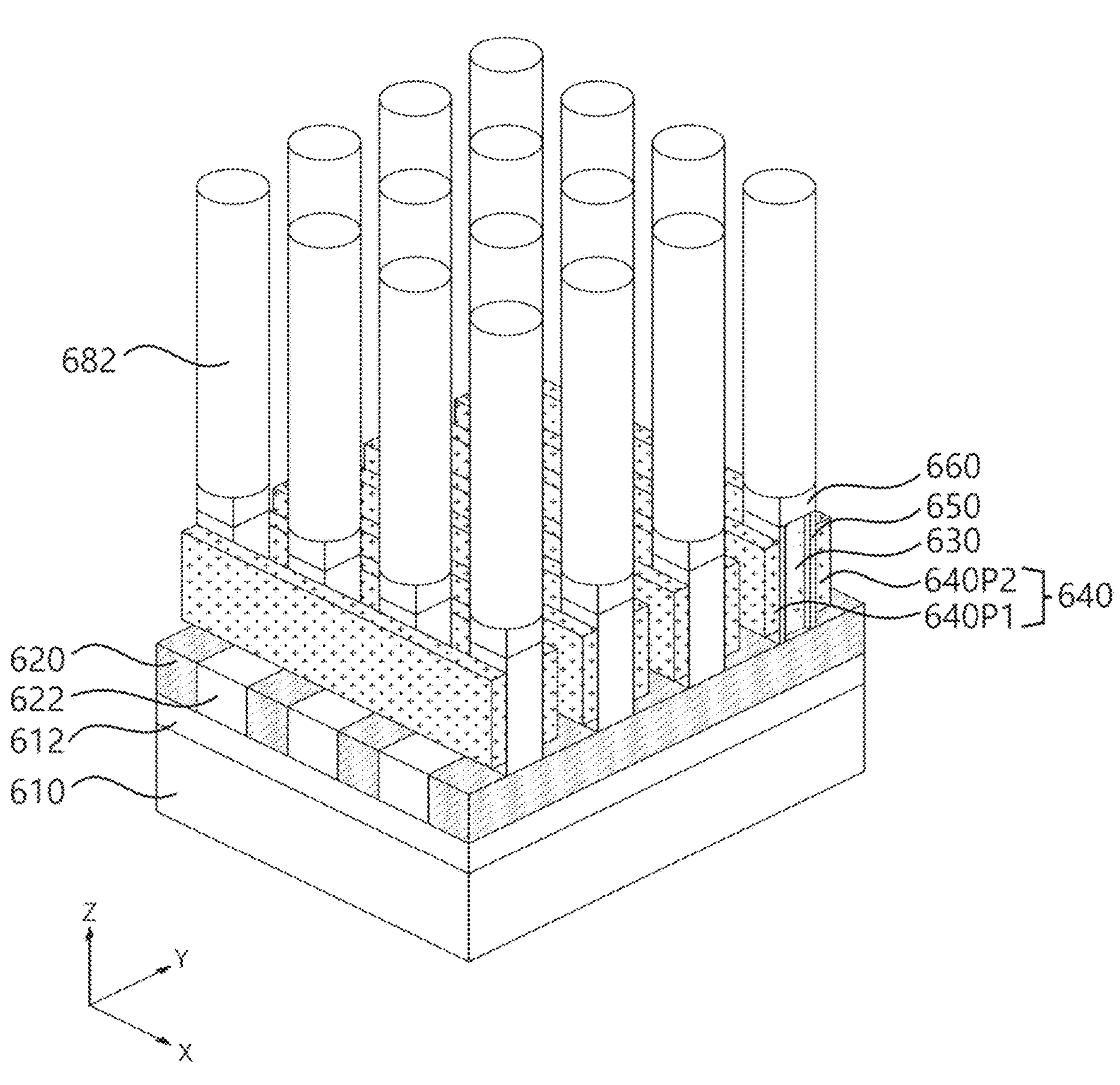
FIG. 10B is a perspective view illustrating a memory cell array according to an example embodiment.
Figure 10C:
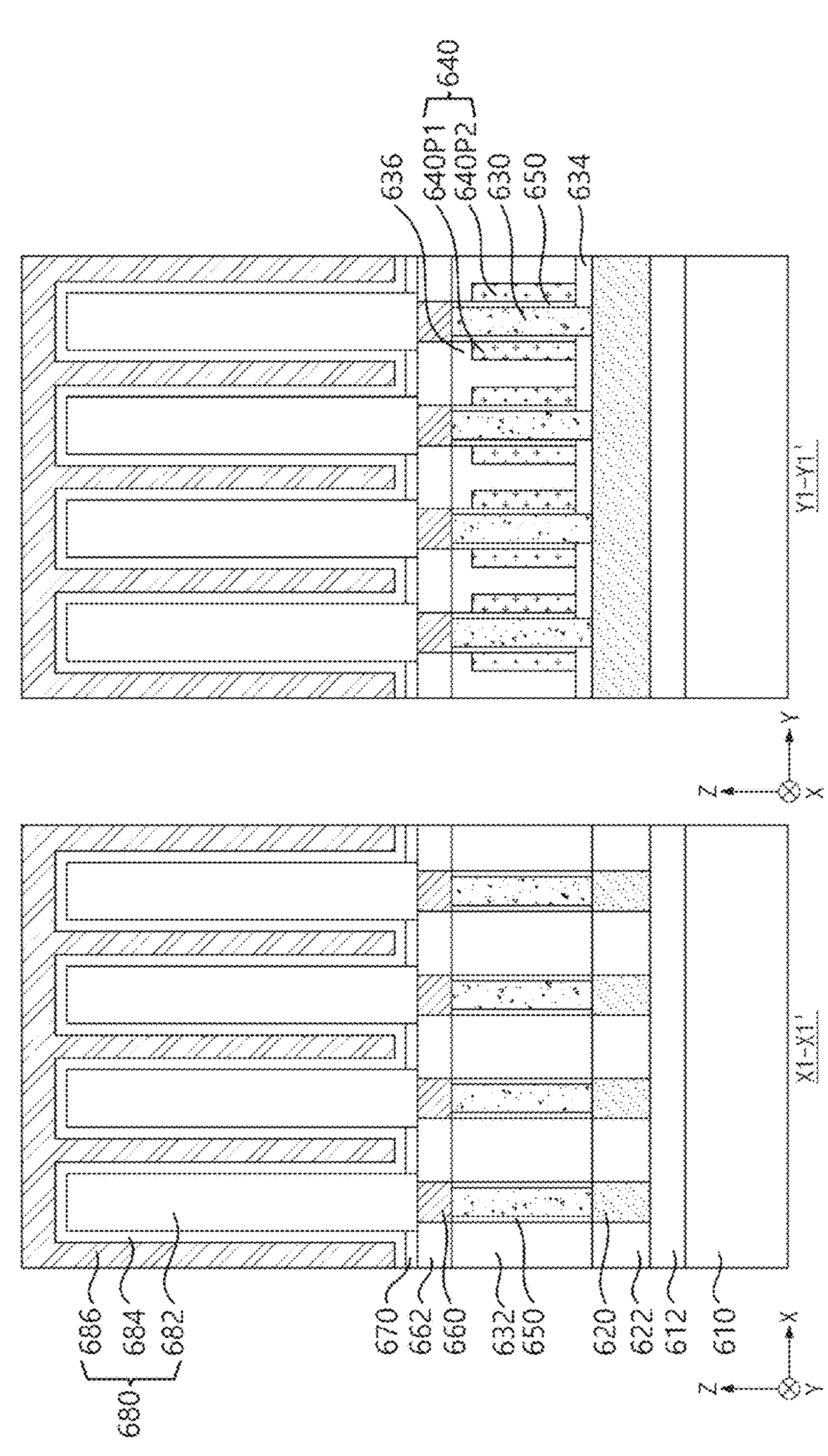
FIG. 10C illustrates sectional views of a memory cell array according to an example embodiment.

Hereinafter, example embodiments of a memory cell array including a vertical channel transistor will be described in more detail with reference to FIGS. 10A to 10E. FIG. 10A is a view illustrating the layout of a memory cell array according to an example embodiment. FIG. 10B is a perspective view illustrating the memory cell array of FIG. 10A. FIG. 10C illustrates sectional views taken along lines X1-X1' and Y1-Y1' of FIG. 10A.

Referring to FIGS. 10A to 10C, the memory cell array 900A may include a substrate 610, a plurality of first conductive lines 620, channel layers 630, gate electrodes 640, gate insulating layers 650, and a capacitor structure 680. The memory cell array 900A may include a vertical channel transistor (VCT). The vertical channel transistor may refer to a structure in which the channel lengths of the channel layers 630 extend from the substrate 610 in the vertical direction.

A lower insulating layer 612 may be disposed on the substrate 610, and the plurality of first conductive lines 620 on the lower insulating layer 612 may be spaced apart from each other in a first direction (an X direction) and may extend in a second direction (a Y direction). A plurality of first insulating patterns 622 may be disposed on the lower insulating layer 612 to fill the spaces between the plurality of first conductive lines 620. The plurality of first insulating patterns 622 may extend in the second direction (the Y direction), and the upper surfaces of the plurality of first insulating patterns 622 may be disposed at the same level as the upper surfaces of the plurality of first conductive lines 620. The plurality of first conductive lines 620 may function as bit lines of the memory cell array 900A.

In some example embodiments, the plurality of first conductive lines 620 may include doped poly silicon, metal, conductive metal nitride, conductive metal silicide, conductive metal oxide, or a combination thereof. For example, the plurality of first conductive lines 620 may be formed of doped poly silicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof, but example embodiments are not limited thereto. The plurality of first conductive lines 620 may include a single layer or multiple layers of the aforementioned materials. In some example embodiments, the plurality of first conductive lines 620 may include a two-dimensional semiconductor material. For example, the two-dimensional semiconductor material may include graphene, carbon nanotubes, or a combination thereof.

The channel layers 630 may be arranged in a matrix form on the plurality of first conductive lines 620 so as to be spaced apart from each other in the first direction (the X direction) and the second direction (the Y direction). The channel layers 630 may have a first width in the first direction (the X direction) and a first height in a third direction (a Z direction). The first height may be greater than the first width. For example, the first height may be about two to ten times the first width, but example embodiments are not limited thereto. A bottom portion of the channel layer 630 may function as a first source/drain area, an upper portion of the channel layer 630 may function as a second source/drain area, and a portion of the channel layer 630 between the first and second source/drain areas may function as a channel area.

In some example embodiments, the channel layer 630 may include an oxide semiconductor material. For example, the oxide semiconductor may include $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_2O$, $Yb_xGa_yZn_zO$, $In_xGa_yO$, or a combination thereof. The channel layer 630 may include a single layer or multiple layers of the oxide semiconductor. In some example embodiments, the channel layer 630 may have band gap energy greater than the ban gap energy of silicon. For example, the channel layer 630 may have a band gap energy of about 1.5 eV to about 5.6 eV. For example, the channel layer 630 may have optimal channel performance when the channel layer 630 has a band gap energy of about 2.0 eV to about 4.0 eV. For example, the channel layer 630 may be polycrystalline or amorphous, but example embodiments are not limited thereto. In some example embodiments, the channel layer 630 may include a two-dimensional semiconductor material. For example, the two-dimensional semiconductor material may include graphene, carbon nanotubes, or a combination thereof.

The gate electrode 640 may extend in the first direction (the X direction) on opposite sidewalls of the channel layer 630. The gate electrode 640 may include a first sub-gate electrode 640P1 facing a first sidewall of the channel layer 630 and a second sub-gate electrode 640P2 facing a second sidewall of the channel layer 630 that faces away from the first sidewall of the channel layer 630. As one channel layer 630 is disposed between the first sub-gate electrode 640P1 and the second sub-gate electrode 640P2, the memory cell array 900A may have a dual gate transistor structure. However, example embodiments are not limited thereto. The second sub-gate electrode 640P2 may be omitted, and only the first sub-gate electrode 640P1 facing the first sidewall of the channel layer 630 may be formed to implement a single gate transistor structure.

The gate electrode 640 may include doped poly silicon, metal, conductive metal nitride, conductive metal silicide, conductive metal oxide, or a combination thereof. For example, the gate electrode 640 may be formed of doped poly silicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof, but example embodiments are not limited thereto.

The gate insulating layer 650 may surround the sidewalls of the channel layer 630 and may be interposed between the channel layer 630 and the gate electrode 640. For example, as illustrated in FIG. 10A, all of the sidewalls of the channel layer 630 may be surrounded by the gate insulating layer 650, and a portion of a sidewall of the gate electrode 640 may make contact with the gate insulating layer 650. In other example embodiments, the gate insulating layer 650 may extend in the extension direction of the gate electrode 640 (that is, in the first direction (the X direction)), and only two sidewalls facing the gate electrode 640 among the sidewalls of the channel layer 630 may make contact with the gate insulating layer 650.

In some example embodiments, the gate insulating layer 650 may be formed of a silicon oxide film, a silicon oxy nitride film, a high-k dielectric film having a higher dielectric constant than the silicon oxide film, or a combination thereof. The high-k dielectric film may be made of metal oxide or metal oxy nitride. For example, a high-k dielectric film that is able to be used as the gate insulating layer 650 may be made of $HfO_2$, HfSiO, HIfSiON, HfTaO, HfTiO, HfZrO, $ZrO_2$, $Al_2O_3$, or a combination thereof, but example embodiments are not limited thereto.

A plurality of second insulating patterns 632 may extend in the second direction (the Y direction) on the plurality of first insulating patterns 622, and the channel layer 630 may be disposed between two adjacent second insulating patterns 632 among the plurality of second insulating patterns 632. In addition, between the two adjacent second insulating patterns 632, a first buried layer 634 and a second buried layer 636 may be disposed in the space between two adjacent channel layers 630. The first buried layer 634 may be disposed on the bottom of the space between the two adjacent channel layers 630, and the second buried layer 636 may be formed on the first buried layer 634 to fill the reset of the space between the two adjacent channel layers 630. The upper surface of the second buried layer 636 may be disposed at the same level as the upper surface of the channel layer 630, and the second buried layer 636 may cover the upper surface of the gate electrode 640. Alternatively, the plurality of second insulating patterns 632 may be formed as a material layer continuous with the plurality of first insulating patterns 622, or the second buried layer 636 may be formed as a material layer continuous with the first buried layer 634.

Capacitor contacts 660 may be disposed on the channel layers 630. The capacitor contacts 660 may be disposed to vertically overlap the channel layers 630 and may be arranged in a matrix form in which the capacitor contacts 660 are spaced apart from each other in the first direction (the X direction) and the second direction (the Y direction). The capacitor contacts 660 may be formed of doped poly silicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof, but example embodiments are not limited thereto. An upper insulating layer 662 may be disposed on the plurality of second insulating patterns 632 and the second buried layer 636 to surround the sidewalls of the capacitor contacts 660.

An etch stop layer 670 may be disposed on the upper insulating layer 662, and the capacitor structure 680 may be disposed on the etch stop layer 670. The capacitor structure 680 may include lower electrodes 682, a capacitor dielectric layer 684, and an upper electrode 686.

The lower electrodes 682 may penetrate the etch stop layer 670 and may be electrically connected to the upper surfaces of the capacitor contacts 660. The lower electrodes 682 may be formed in a pillar type extending in the third direction (the Z direction), but example embodiments are not limited thereto. In some example embodiments, the lower electrodes 682 may be disposed to vertically overlap the capacitor contacts 660 and may be arranged in a matrix form in which the lower electrodes 682 are spaced apart from each other in the first direction (the X direction) and the second direction (the Y direction). Alternatively, landing pads may be additionally disposed between the capacitor contacts 660 and the lower electrodes 682, and the lower electrodes 682 may be arranged in a hexagonal shape.

Figure 10D:
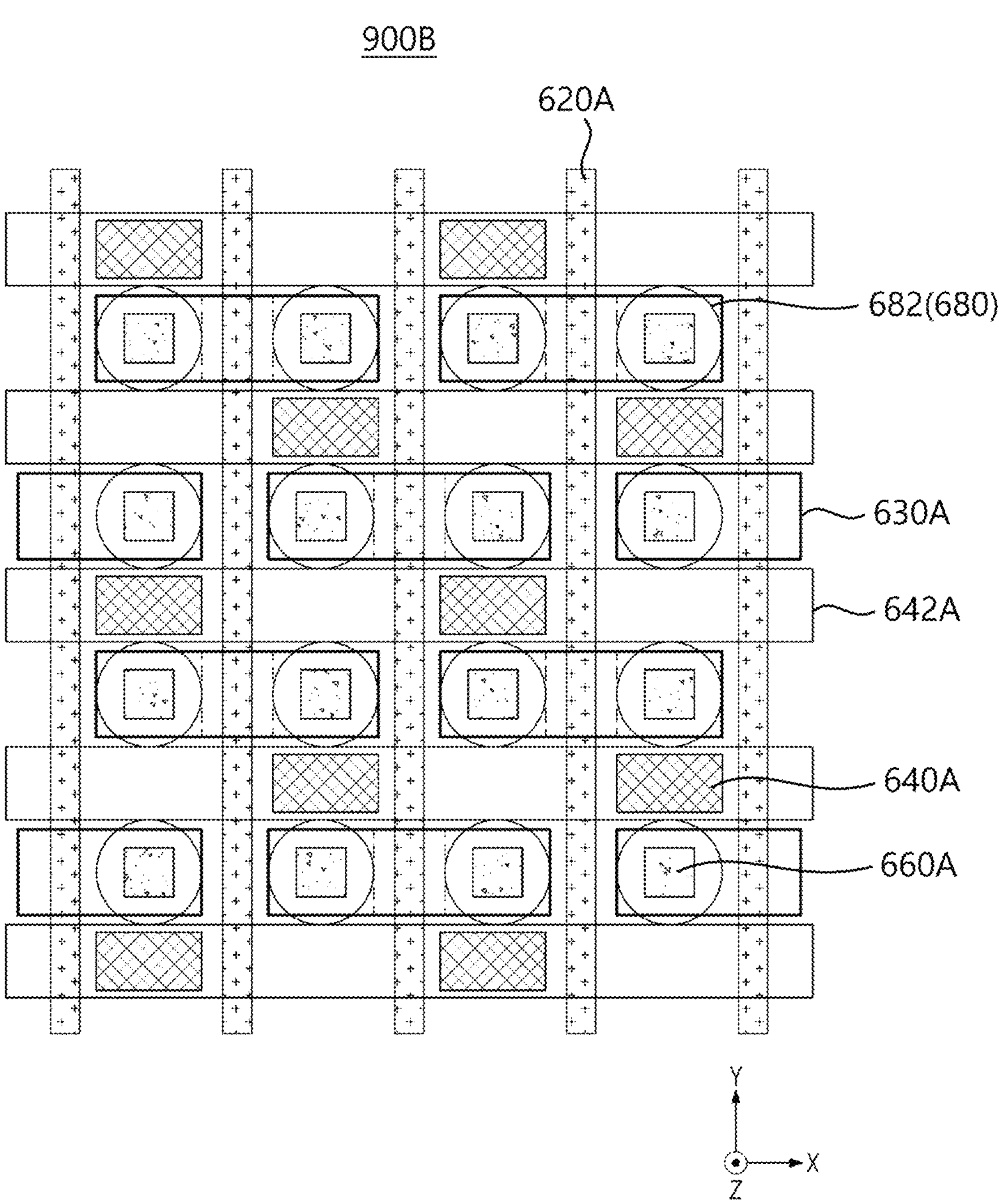
FIG. 10D is a view illustrating the layout of a memory cell array according to an example embodiment.
Figure 10E:
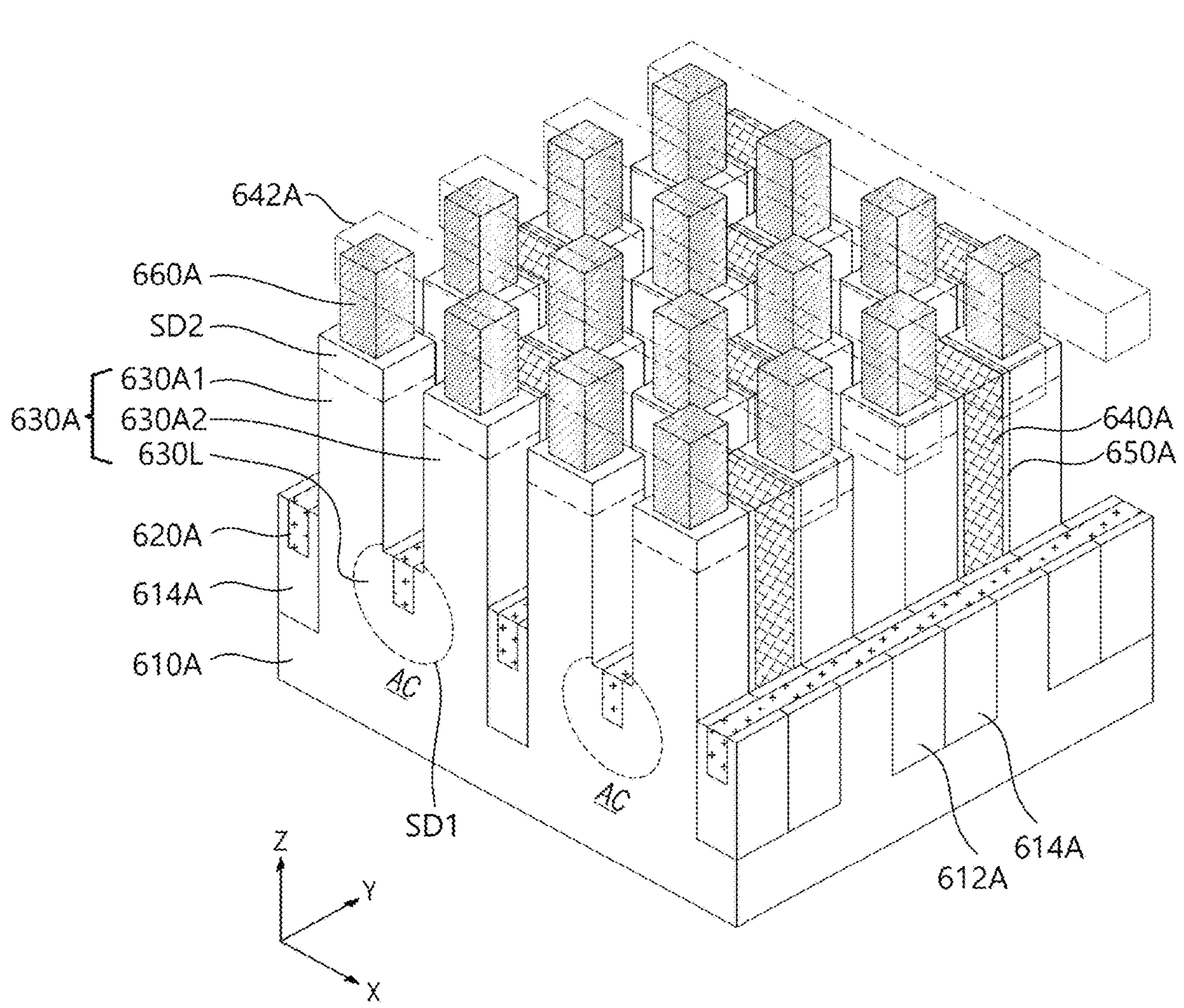
FIG. 10E is a perspective view illustrating a memory cell array according to an example embodiment.

FIG. 10D is a view illustrating the layout of a memory cell array according to an example embodiment, and FIG. 10E is a perspective view illustrating the memory cell array of FIG. 10D.

Referring to FIGS. 10D and 10E, the memory cell array 900B may include a substrate 610A, a plurality of first conductive lines 620A, channel structures 630A, contact gate electrodes 640A, a plurality of second conductive lines 642A, and a capacitor structure 680. The memory cell array 900B may include a vertical channel transistor.

A plurality of active areas AC may be defined on the substrate 610A by a first device isolation film 612A and a second device isolation film 614A. The channel structures 630A may be disposed in the active areas AC, respectively. Each of the channel structures 630A may include a first active pillar 630A1 and a second active pillar 630A2 that extend in the vertical direction and a connecting portion 630L connected to the bottom of the first active pillar 630A1 and the bottom of the second active pillar 630A2. A first source/drain area SD1 may be disposed in the connecting portion 630L, and a second source/drain area SD2 may be disposed at the tops of the first and second active pillars 630A1 and 630A2. Each of the first active pillar 630A1 and the second active pillar 630A2 may constitute an independent unit memory cell.

The plurality of first conductive lines 620A may extend in a direction crossing the plurality of active areas AC, for example, in the second direction (the Y direction). One first conductive line 620A among the plurality of first conductive lines 620A may be disposed on the connecting portion 630L between the first active pillar 630A1 and the second active pillar 630A2. The one first conductive line 620A may be disposed on the first source/drain area SD1. Another first conductive line 620A adjacent to the one first conductive line 620A may be disposed between two channel structures 630A. One first conductive line 620A among the plurality of first conductive lines 620A may function as a common bit line included in two unit memory cells constituted by the first active pillar 630A1 and the second active pillar 630A2 disposed on the opposite sides of the one first conductive line 620A.

One contact gate electrode 640A may be disposed between two channel structures 630A adjacent to each other in the second direction (the Y direction). For example, the contact gate electrode 640A may be disposed between the first active pillar 630A1 included in one channel structure 630A and the second active pillar 630A2 included in the other channel structure 630A and may be shared by the first active pillar 630A1 and the second active pillar 630A2 disposed on the opposite sides of the contact gate electrode 640A. A gate insulating layer 650A may be disposed between the contact gate electrode 640A and the first active pillar 630A1 and between the contact gate electrode 640A and the second active pillar 630A2. The plurality of second conductive lines 642A may extend in the first direction (the X direction) on the upper surfaces of the contact gate electrodes 640A. The plurality of second conductive lines 642A may function as word lines of the memory cell array 900B.

Capacitor contacts 660A may be disposed on the channel structures 630. The capacitor contacts 660A may be disposed on the second source/drain areas SD2, and the capacitor structure 680 may be disposed on the capacitor contacts 660A.

According to an example embodiment, a plurality of metal layers may be formed under the memory cell arrays 900A and 900B. In addition, pad areas including a redistribution layer RDL may be formed over the memory cell arrays 900A and 900B.

Although it has been described that the CoP structure includes two chips, that is, the first chip 100 and the second chip 200, example embodiments are not limited thereto. According to an example embodiment, three or more chips may be stacked to implement a semiconductor memory device having a CoP structure. Specifically, according to an example embodiment, at least one chip having memory cell arrays implemented therein and at least one chip having core/peripheral circuits implemented therein may be stacked to implement a semiconductor memory device having a CoP structure.

According to various example embodiments described above, the passive elements may be implemented in the remaining area of the semiconductor memory device having the CoP structure. Accordingly, the characteristics of the semiconductor memory device may be improved.

While aspects of example embodiments have been particularly shown and described, it will be understood that various changes in form and details may be made therein without departing from the spirit and scope of the following claims.

What is claimed is:

1. A semiconductor memory device comprising:

a first chip comprising a cell area and a remaining area, the cell area comprising a plurality of memory cells; and a second chip comprising a core area corresponding to the cell area and a peripheral area corresponding to the remaining area, the first chip and the second chip overlap along a vertical direction, wherein core circuits are provided in the core area of the second chip and peripheral circuits are provided in the peripheral area of the second chip, wherein the core circuits and the peripheral circuits are configured to control operation of the plurality of memory cells, and wherein passive elements electrically connected to the peripheral circuits of the second chip are provided in the remaining area of the first chip.

2. The semiconductor memory device of claim 1, wherein the cell area comprises a first cell area and a second cell area spaced apart from each other, and wherein the remaining area is between the first cell area and the second cell area.

3. The semiconductor memory device of claim 2, wherein the core area comprises a first core area and a second core area, the first core area comprising first core circuits corresponding to memory cells in the first cell area and the second core area comprising second core circuits corresponding to memory cells in the second cell area, and wherein the peripheral area is between the first core area and the second core area, and wherein the peripheral circuits are further configured to control operation of the first core circuits and the second core circuits.

4. The semiconductor memory device of claim 1, wherein the core circuits comprise any one or any combination of a sub-word line driver, a bit line sense amplifier, a row decoder, or a column decoder, and wherein the peripheral circuits comprise circuits configured to decode a command and control input/output of an address and data.

5. The semiconductor memory device of claim 1, wherein the first chip and the second chip are electrically connected to each other by first bonding metals formed at the bottom of the first chip that are bonded to second bonding metals formed at the top of the second chip, and wherein the passive elements are connected with the peripheral circuits through the first bonding metals and the second bonding metals that are bonded to each other.

6. The semiconductor memory device of claim 1, wherein the first chip comprises a plurality of metal layers, and wherein the passive elements are formed in the remaining area by using at least one metal layer among the plurality of metal layers.

7. The semiconductor memory device of claim 6, wherein the plurality of metal layers comprise lower metal layers and a redistribution layer (RDL), wherein the plurality of memory cells are provided between the plurality of metal layers and the RDL, and wherein the passive elements comprise an inductor formed using at least one layer among the lower metal layers and the RDL.

8. The semiconductor memory device of claim 7, wherein the inductor is formed using a lower metal layer made of a material having a relatively low unit resistance among the lower metal layers.

9. The semiconductor memory device of claim 7, wherein the passive elements comprise a resistor formed using a lower metal layer comprising a material having a high unit resistance among the lower metal layers.

10. The semiconductor memory device of claim 7, wherein the passive elements comprise a capacitor formed using at least one metal layer among the plurality of metal layers.

11. The semiconductor memory device of claim 10, wherein the capacitor comprises any one or any combination of a metal-insulator-metal (MIM) capacitor or a metal-oxide-metal (MOM) capacitor.

12. The semiconductor memory device of claim 1, wherein the remaining area comprises a plurality of dummy cell transistors, and wherein the passive elements comprise any one or any combination of a resistor or a capacitor formed using the plurality of dummy cell transistors.

13. The semiconductor memory device of claim 12, wherein the resistor comprises the plurality of dummy cell transistors.

14. The semiconductor memory device of claim 12, wherein the capacitor comprises a metal-oxide-semiconductor (MOS) capacitor.

15. The semiconductor memory device of claim 1, wherein the remaining area comprise a plurality of dummy cell capacitors, and wherein the passive elements comprise a capacitor which comprises the plurality of dummy cell capacitors.

16. The semiconductor memory device of claim 1, wherein the remaining area comprises a filter comprising a combination of the passive elements, and wherein the filter is configured to filter a signal applied through a pad formed at a top of the first chip and provide the signal to the peripheral circuits of the second chip.

17. The semiconductor memory device of claim 1, wherein the remaining area comprises a delay logic comprising a combination of the passive elements, and wherein at least some of the peripheral circuits are configured to operate using the delay logic.

18. The semiconductor memory device of claim 1, wherein the plurality of memory cells comprise a vertical channel transistor.

19. A semiconductor memory device comprising:

a first chip comprising a cell area, a dummy area and a plurality of cell array mats that are provided in the cell area and spaced apart from the dummy area; and a second chip comprising a core area and a peripheral area, wherein core circuits configured to drive the plurality of cell array mats, respectively, are provided in the core area and peripheral circuits configured to control operation of the core circuits are provided in the peripheral area, and the first chip and the second chip overlap along a vertical direction, wherein the dummy area of the first chip overlaps the peripheral area of the second chip along the vertical direction and comprises passive elements connected to the peripheral circuits of the second chip.

20. A semiconductor memory device comprising:

a first chip comprising a cell area, a remaining area and a plurality of memory cells provided in the cell area; and a second chip comprising a core area and a peripheral area, wherein core circuits are provided in the core area and peripheral circuits are provided in the peripheral area, and the first chip and the second chip overlap along a vertical direction, wherein the first chip comprises a plurality of metal layers, and wherein the remaining area of the first chip overlaps the peripheral area of the second chip along the vertical direction and comprises an inductor that is electrically connected to the peripheral circuits, the inductor being formed using at least one metal layer among the plurality of metal layers of the first chip.

* * * * *